(12) United States Patent
Xu

(10) Patent No.: US 9,893,040 B2
(45) Date of Patent: Feb. 13, 2018

(54) FLIP-CHIP STRUCTURE OF GROUP III SEMICONDUCTOR LIGHT EMITTING DEVICE

(71) Applicant: XiangNeng HuaLei Optoelectronic Co., Ltd., Chenzhou (CN)

(72) Inventor: Shuncheng Xu, Chenzhou (CN)

(73) Assignee: XIANGNENG HUALEI OPTOELECTRONIC CO., LTD, Hunan (CN)

( * ) Notice: Subject to any disclaimer, the term of this patent is extended or adjusted under 35 U.S.C. 154(b) by 0 days.

(21) Appl. No.: 15/318,658

(22) PCT Filed: May 5, 2016

(86) PCT No.: PCT/CN2016/081118
§ 371 (c)(1),
(2) Date: Dec. 13, 2016

(87) PCT Pub. No.: WO2016/177335
PCT Pub. Date: Nov. 10, 2016

(65) Prior Publication Data
US 2017/0117259 A1    Apr. 27, 2017

(30) Foreign Application Priority Data

May 5, 2015    (CN) .......................... 2015 1 0224859

(51) Int. Cl.
*H01L 25/07*    (2006.01)
*H01L 25/075*    (2006.01)
(Continued)

(52) U.S. Cl.
CPC .......... *H01L 25/0756* (2013.01); *H01L 33/38* (2013.01); *H01L 33/42* (2013.01); *H01L 33/46* (2013.01); *H01L 33/62* (2013.01)

(58) Field of Classification Search
CPC ..... H01L 33/42; H01L 25/0756; H01L 33/38; H01L 33/46; H01L 33/62
See application file for complete search history.

(56) References Cited

U.S. PATENT DOCUMENTS 6,395,572 B1 *    5/2002    Tsutsui ................... H01L 33/22
                                                      257/E33.074
2005/0052878 A1 *    3/2005    Yamada ................. C09K 11/08
                                                      362/460
(Continued)

FOREIGN PATENT DOCUMENTS

CN    101859847 A    10/2010
CN    101872824 A    10/2010
(Continued)

OTHER PUBLICATIONS

International Search Report for PCT/CN2016/081118.
Written Opinion of the International Search Authority for PCT/CN2016/081118.

*Primary Examiner* — Charles Garber
*Assistant Examiner* — S. M. S Imtiaz

(57) ABSTRACT

This application refers to a flip-chip structure of Group III semiconductor light emitting device. The flip-chip structure includes: a substrate, a buffer layer, nitride semiconductor layer, an active layer, a P type nitride semiconductor layer, a transparent conductive layer, a first insulation layer, a P type contact metal, a N type contact metal, a second insulation layer, a flip-chip P type electrode and a flip-chip N type electrode. The substrate, the buffer layer, the N type nitride semiconductor layer, the active layer, the P type nitride semiconductor layer which grow sequentially from bottom to top form a linear convex mesa. In this application, structure of the first insulation layer which is formed by aBraggs reflective layer, a metal layer and the multilayer oxide insulation layer, acts as a reflector structure and an insulation layer to replace the flip-chip reflector structure design and the first insulation layer, so that a metal protective layer can be omitted.

13 Claims, 8 Drawing Sheets

(51) Int. Cl.
*H01L 33/46* (2010.01)
*H01L 33/62* (2010.01)
*H01L 33/38* (2010.01)
*H01L 33/42* (2010.01)

(56) References Cited

U.S. PATENT DOCUMENTS

| | | | |
|---|---|---|---|
| 2008/0211416 A1* | 9/2008 | Negley | H01L 27/15 |
| | | | 315/193 |
| 2010/0012954 A1 | 1/2010 | Yu et al. | |
| 2010/0171125 A1* | 7/2010 | Yoo | H01L 33/44 |
| | | | 257/76 |
| 2015/0001561 A1* | 1/2015 | Katsuno | H01L 25/0756 |
| | | | 257/90 |
| 2015/0034987 A1* | 2/2015 | Hayashi | H01L 33/60 |
| | | | 257/98 |
| 2016/0064617 A1* | 3/2016 | Yang | H01L 33/46 |
| | | | 257/98 |

FOREIGN PATENT DOCUMENTS

| | | |
|---|---|---|
| CN | 104538513 A | 4/2015 |
| CN | 104576867 A | 4/2015 |
| CN | 104810439 A | 7/2015 |
| CN | 104821350 A | 8/2015 |
| CN | 104821351 A | 8/2015 |
| CN | 104952995 A | 9/2015 |

\* cited by examiner

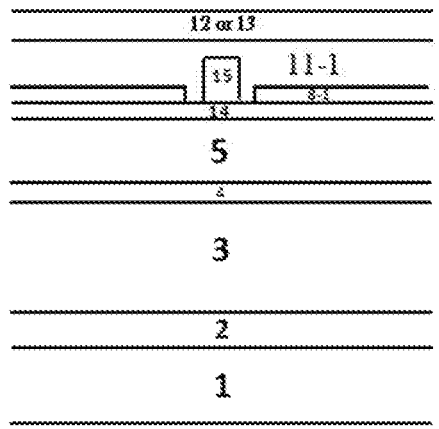
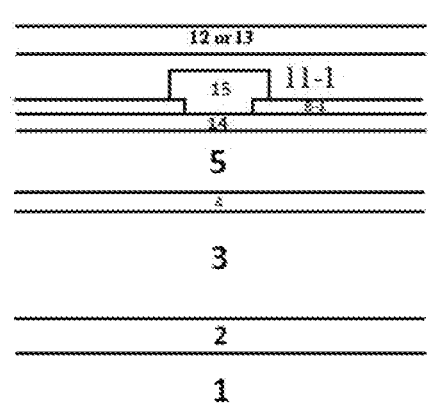
FIG. 5A        FIG. 5B
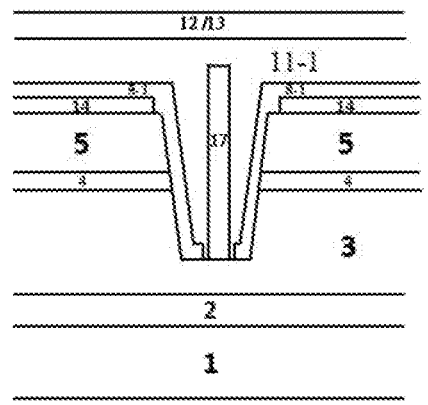
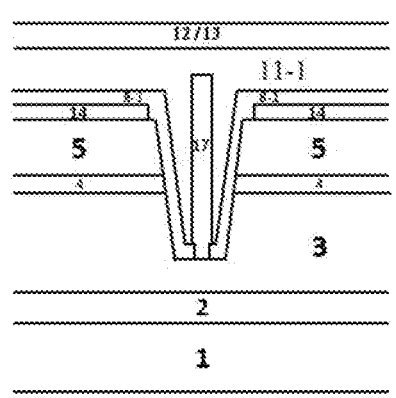
FIG. 6A        FIG. 6B
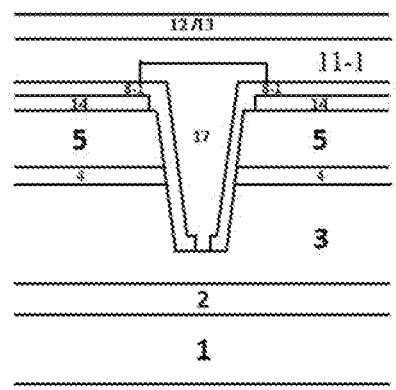
FIG. 6C

FLIP-CHIP STRUCTURE OF GROUP III SEMICONDUCTOR LIGHT EMITTING DEVICE

FIELD OF THE INVENTION

The application refers to a technical field of a semiconductor illumination, more particularly to a flip-chip structure of III group semiconductor light emitting device.

DESCRIPTION OF THE RELATED ART

Traditionally, a light emitting diode uses a normal structure: in which a transparent conductive layer generally uses high penetration rate materials such as ITO and AZO etc. and the electrodes use the materials such as Cr or Pt or Au etc. However, in a flip-chip structure, light activated by active layer emits from the other base of the electrode, thus the requirement of a P type electrode is changed, high reflective material which is used to cover the whole P type nitride semiconductor layer, is used as a reflector. One way to fulfill the requirement is that a P type nitride semiconductor layer is plated by a high penetration transparent electrode with high reflective metal, such as ITO or Ag etc. The other way is that P type nitride semiconductor layer is plated by a high reflective metal and used as ohm contact and reflector, such as Ag and Al. No matter which way is selected, metal protective layer 7 (guard metal) must be used on the back of high reflective material to cover high reflective material to avoid instability. The metal protection layer 7, comprises is formed by the steps of: defining a titanium layer and a tungsten layer in sequence or a titanium tungsten alloy layer and then etching with a plurality of holes (vias), structure diagram shown in FIG. 1, covering entire surface of a first insulation layer 8, opening holes to access an N type nitride semiconductor layer and metal protection layer, re-plating a P type contact metal and an N type contact metal, covering a whole second insulation layer, opening holes to access the P type contact metal and the N type contact metal, plating the flip-chip structure P type electrode and N type electrode finally. Due to the high accuracy of the etching holes, complex process is required, and the production cost becomes higher.

SUMMARY OF THE INVENTION

In order to solve the defects existing in the prior art, the application aims to provide a flip-chip structure of III group semiconductor light emitting device.

In this application, a flip-chip structure of III group semiconductor light emitting device is provided, which includes: a substrate, a buffer layer, a N type nitride semiconductor layer, an active layer, a P type nitride semiconductor layer, a transparent conductive layer, a first insulation layer structure, a P type contact metal, a N type contact metal, a second insulation layer structure, a flip-chip P type electrode and a flip-chip N type electrode, wherein the substrate, the buffer layer, the N type nitride semiconductor layer, the active layer, the P type nitride semiconductor layer which grow sequentially from bottom to top form a linear convex mesa;

the linear convex mesa comprises a first top surface, a side surface and a second top surface, the first top surface of the linear convex mesa and the second top surface of the linear convex mesa individually connects with the side surface to form a L shape structure, the first top surface of the linear convex mesa being the top surface of the P type nitride semiconductor layer, the second top surface of the linear convex mesa being the top surface of the N type nitride semiconductor layer;

the transparent conductive layer located on top of the first top surface of the linear convex mesa;

the first insulation layer structure located on the first top surface of the linear convex mesa, the side surface, the second top surface of the linear convex mesa and the surface of the transparent conductive layer;

a bottom end of the P type contact metal is located between the first insulation layer structure and the transparent conductive layers or on the transparent conductive layer;

a bottom end of the N type contact metal located between the first insulation layer structure and the second top surfaces or on the second top surface of the linear convex mesa;

the second insulation layer structure located on the first insulation layer structure, the top surface of the P type contact metal and the N type contact metal;

a bottom end of the flip-chip P type electrode located on the surface of the P type contact metal and the second insulation layer structure;

a bottom end of the flip-chip N type electrode located on the surface of the N type contact metal and the second insulation layer structure, the flip-chip structure has an isolation groove, which is located around the flip-chip structure, the isolation groove is attained by way of etching to expose the substrate, the surface of the isolation groove has the first insulation layer structure and/or the second insulation layer structure, the first insulation layer structure formed by the single-layer oxide insulation layer, the multilayer oxide insulation layer, and a Braggs reflective layer-metal layer-single layer oxide insulation layer or formed by a Braggs reflective layer-metal layer-multilayer oxide insulation layer.

Preferably, the material of the single-layer oxide insulation layer is one of aluminum oxide, silicon oxide, titanium oxide, tantalic oxide, niobium oxide and silicon nitride, the material of the multilayer oxide insulation layer is at least two of the aluminum oxide, silicon oxide, titanium oxide, tantalic oxide, niobium oxide, silicon oxide and silicon nitride.

Preferably, the thickness of each layer of single-layer oxide insulation layer or the thickness of each layer of the multilayer oxide insulation layer is in a range of 30-200 nm.

Preferably, the Braggs reflective layer is formed by silicon oxide and titanium oxide, or formed by silicon oxide and tantalic oxide, or formed by silicon oxide and niobium oxide; wherein the thickness of the silicon oxide is in a range of 30-1000 nm, the thickness of the titanium oxide is in a range of 10-200 nm, the thickness of the tantalic oxide is in a range of 10-200 nm, the thickness of niobium oxide is in a range of 10-200 nm.

Preferably, the Braggs reflective layer is formed by 3.5 pairs of silicon dioxide/titanium dioxide/silicon dioxide/titanium dioxide/silicon dioxide/titanium dioxide/silicon dioxide, or formed by 3.5 pairs of silicon dioxide/tantalic oxide/silicon dioxide/tantalic oxide/silicon dioxide/tantalic oxide/silicon dioxide, or formed by 3.5 pairs of silicon dioxide/niobium oxide/silicon dioxide/niobium oxide/silicon dioxide/niobium oxide/silicon dioxide.

Preferably, when the first insulation layer structure is stacked by the Braggs reflective layer-metal layer-single-layer oxide insulation layer or stacked by the Braggs reflective-metal layer-multilayer oxide insulation layer, the bottom end of the metal layer is located on the top surface of the Braggs reflective layer of the first insulation layer structure, and/or is located in the multilayer oxide insulation layer of the first insulation layer structure.

Preferably, the material of the metal layer is at least one of the silver, aluminum, silver indium, platinum, nickel and titanium, wherein each thickness of the silver, the aluminum, the silver indium and the platinum is in a range of 50-500 nm, each thickness of the nickel and titanium is in a range of 0.3-30 nm.

Preferably, the bottom end of the P type contact metal is located on the surface of the first insulation layer structure and the transparent conductive layer, the bottom end of the N type contact metal is located on the surface of the first insulation layer structure and the second top surface of the linear convex mesa.

Preferably, the P type contact metal comprises a P type linear electrode and a P type solder pad; the bottom end of the P type solder pad is located on the surface of the first insulation layer structure, the bottom end of the P type linear electrode is located on the transparent conductive layer or on both surfaces of the first insulation layer structure and the transparent conductive layer; the N type contact metal comprises N type linear electrode and a N type solder pad, the bottom end of the N type solder pad is located on the surface of the first insulation layer structure, the bottom end of the N type linear electrode is located on the second top surface of the linear convex mesa or on both surfaces of the first insulation layer structure and the second top surface of the linear convex mesa.

Preferably, the P type contact metal comprises a P type linear electrode and a P type contact metal, the bottom end of the P type linear electrode is located on the transparent conductive layer or on both surfaces of the first insulation layer structure and transparent conductive layer, the bottom end of the P type contact metal is located on the surface of the first insulation layer structure; the N type contact metal comprises N type linear electrode and N type connection metal, the bottom end of the N type linear electrode is located on the second top surface of the linear convex mesa or on both surfaces of the first insulation layer structure and the second top surface of the linear convex mesa, the bottom end of the N type connection metal is located on the surface of the first insulation layer structure.

Preferably, both structures of the P type contact metal and the N type contact metal are formed by single-layer metal layer or multilayer metal layer;

when both structures of the P type metal layer and the N type metal layer are formed by the single-layer, the material of the single-layer metal layer consists of at least one of aluminum, titanium, platinum, gold, rhodium, tungsten, nickel, silver or silver indium, the thickness of the single-layer metal layer is in a range of 50-3000 nm;

when both structures of the P type metal layer and the N type metal layer are formed by multilayer metal layers, which sequentially comprises a first metal layer, a middle metal layer and an end metal layer, therein the material of the first metal layer comprises one of nickel, titanium, chromium, the material of the middle metal layer comprises at least one of aluminum, titanium, chromium, platinum, gold, rhodium, tungsten, nickel, silver, or silver indium, the material of the end metal layer comprises one of nickel, titanium and chromium, and the thickness of the first metal layer is in a range of 0.3-300 nm, the thickness of each layer of the middle metal layer is in a range of 10-3000 nm, the thickness of the end metal layer is in a range of 0.3-300 nm.

Preferably, the second insulation layer structure is formed by a single-layer oxide insulation layer or a multilayer oxide insulation layer, wherein the material of the single-layer oxide insulation layer is formed by one of aluminum oxide, silicon dioxide, titanium dioxide, tantalic oxide, niobium oxide, silicon oxide and silicon nitride, the multilayer oxide insulation is formed by at least two of the combinations of aluminum oxide, silicon dioxide, titanium dioxide, tantalic oxide, niobium oxide, silicon oxide and silicon nitride, a thickness of each layer of the single-layer oxide insulation layer and the multilayer oxide insulation is in a range of 30-2000 nm.

Preferably, both structures of the flip-chip P type electrode and the flip-chip N type electrode sequentially comprise a Ti layer, a second Ni layer, an Au layer from inner to outer, or sequentially comprise a middle Cr layer, a Pt layer, an Au layer, the second Ni layer, a Pt layer, the second Ni layer, an Au—Sn layer from inner to outer;

or sequentially comprise a first Ni layer, an Al layer, the second Ni layer, the Au layer from inner to outer;

or sequentially comprise the middle Cr layer, the Pt layer, the Au layer from inner to outer;

or sequentially comprise the middle Cr layer, the second Ni layer and the Au layer from inner to outer;

or sequentially comprise a first Ni layer, the Al layer, the middle Cr layer, the second Ni layer and the Au layer from inner to outer;

or sequentially comprise a first Ni layer, the Al layer, the middle Cr layer, the Pt layer and the Au layer from inner to outer;

or sequentially comprise a first Ni layer, the Al layer, the second Ni layer, the Pt layer and the Au layer from inner to outer;

or sequentially comprise a first Ni layer, the Al layer, the Ti layer, the Pt layer and the Au layer from inner to outer;

or sequentially comprise a first Cr layer, the Al layer, the middle Cr layer, the Pt layer and the Au layer from inner to outer;

or sequentially comprise a first Cr layer, the Al layer, the Ni layer, the Pt layer and the Au layer from inner to outer;

therein the thickness of the first Ni layer is in a range of 0.4-3 nm, the thickness of the second Ni layer is in a range of 10-300 nm, the thickness of the Ti layer is in a range of 10-300 nm, the thickness of the Al layer is in a range of 50-300 nm, the thickness of the Au layer is in a range of 20-3000 nm, the thickness of the first Cr layer is in a range of 0.4-5 nm, the thickness of the middle Cr layer is in a range of 10-300 nm, the thickness of the Pt layer is in a range of 10-300 nm, the thickness of the Au—Sn layer is in a range of 1000-5000 nm.

Compared with the prior art, the flip-chip structure of III group semiconductor light emitting device in this application, has the following advantages:

The application is provided for using the linear convex mesa to replace a plurality of holes (vias) in the prior art In this application, the first insulation layer structure, which is formed by the Braggs reflective layer, the metal layer and the single-layer of oxide insulation, or is formed by the Braggs reflective layer, the metal layer and the multilayer oxide insulation layer, acts as a reflector structure and an insulation layer to replace the flip-chip reflector structure design and the first insulation layer, and a metal protective layer can be omitted. Furthermore, no reflector structure is provided on the side wall of the traditional flip-chip linear convex mesa without a reflector structure. The reflector structure can be located on the side wall of the linear convex mesa in the application, and an isolation groove can be arranged as well. The isolation groove is also arranged with the reflector structure.

In this application, the first step in which the transparent conductive layer and the line convex mesa pattern can be made at the same time, which not only simplifies one process, but also solves the alignment defects between the transparent conductive layer and the linear convex mesa pattern.

In this application, when the first insulation layer structure is formed by the single-layer or multilayer oxide insulation layer, it is plated with the P type contact metal and the N type contact metal, the P type contact metal and the N type contact metal are comprising of the P type linear electrode, the N type linear electrode, the P type solder pad, the N type solder pad, the structure diagram FIG. 2e shows the normal structure. In this step, the photoelectric properties of the normal structure can be measured out, and the photoelectric properties of the flip-chip structure can be conjectured, such as the conjecture does not meet the photoelectric properties of the flip-chip structure. In this step, shipment with normal structure or rework can also be done.

In this application, when the first insulation layer structure is stacked by the Braggs reflective layer, the metal layer and the single layer oxide insulation, or is stacked by the Braggs reflective layer, the metal layer and the multilayer oxide insulation, it is plated with P type contact metal and N type contact metal. Thus the photoelectric properties of the flip-chip structure can be measured out in this step.

In this application, the transparent conductive layer and the first insulation layer structure of the new structure is arranged sequentially on the first surface of the linear convex mesa. Namely, in this application, "conductive metal layer with high reflectivity of 6" and ITO or P type nitride semiconductor layer is not set in direct contact on the P type nitride semiconductor layer, but the non-conductive first conductive insulation layer structure 8 (specifically Braggs reflective) and the transparent conductive layer which is located on top of the P type nitride semiconductor layer is in direct contact. And thus it makes the structure of flip-chip LED chip in this application significantly different from the flip-chip structure shown in FIG. 1.

when the first insulation layer structure of the application is stacked by the Braggs reflective layer, the metal layer and the single layer oxide insulation, or is stacked by the Braggs reflective layer, the metal layer and the multilayer oxide insulation, the first insulation layer structure is provided with a metal interlayer structure, in particular the metal layer is located between the Braggs reflective layer and the multilayer oxide insulation layer, or the metal layer is sandwiched inside the internal layer of the multilayer oxide insulation. Therefore, in order to obtain a flip-chip LED chip, this application provides novel insulation layer structure.

Of course, the implementation of the application of any product will not necessarily require all of the mentioned technical results above can be achieved at the same time.

BRIEF DESCRIPTION OF THE ATTACHED DRAWINGS

The attached drawings described here which is provided for further understanding of this application, constitute a part of the application, and the illustrative embodiment is used for the interpretation of this application, the application does not constitute improper limit.

In the drawings:

FIG. 5a to FIG. 5b are the cross-section view of the P type linear electrode.

FIG. 6a to FIG. 6b are the cross-section view of the N type linear electrode.

Figure 7A:
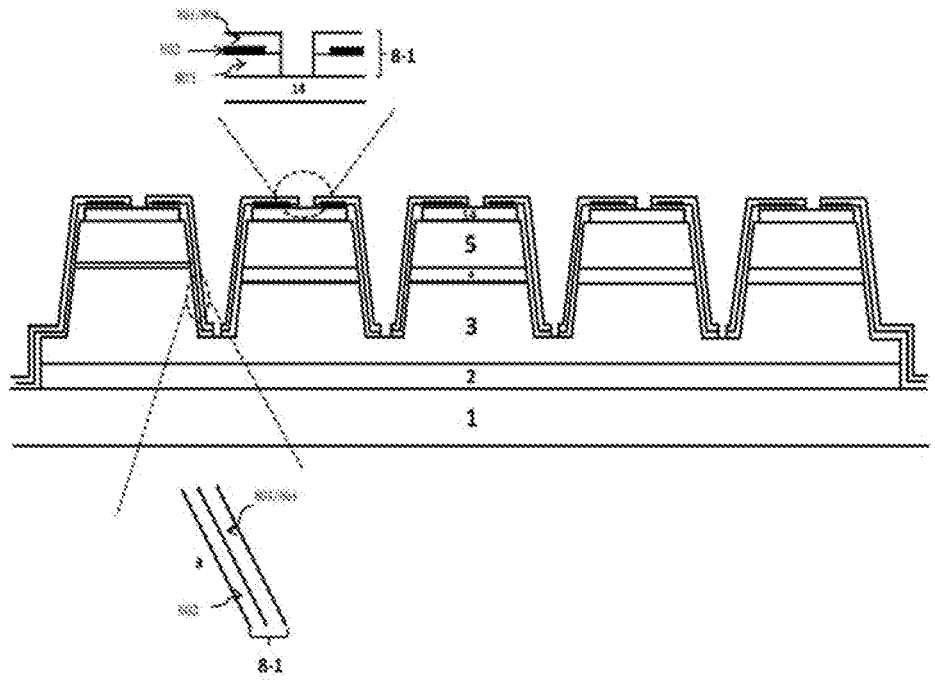
Figure 7B:
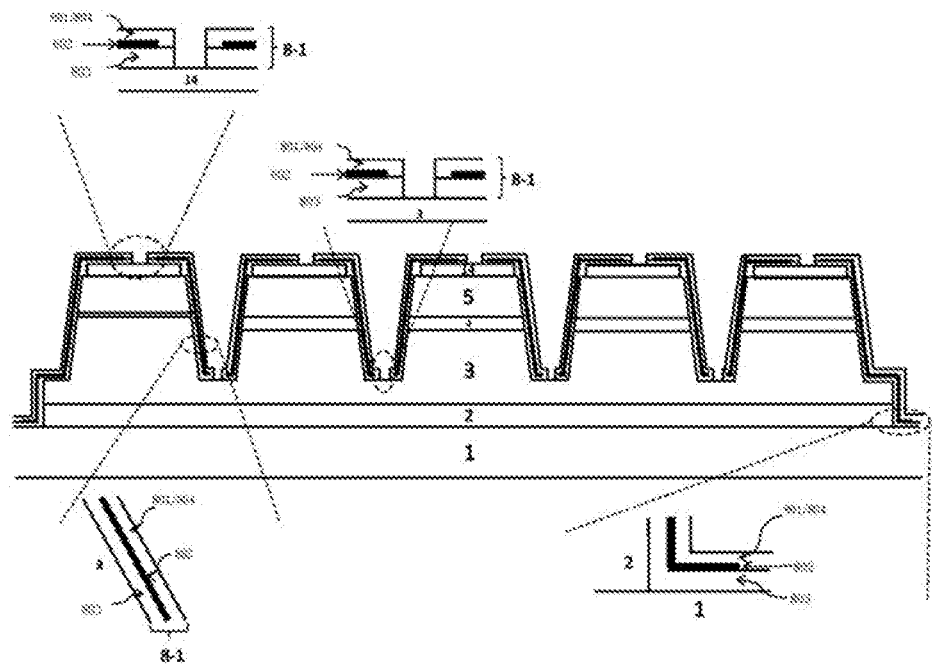

FIG. 7a to FIG. 7b area structure diagram when the first insulation layer is formed by Braggs reflective layer, metal layer and single-layer (multilayer) oxide insulation.

Figure 8A:
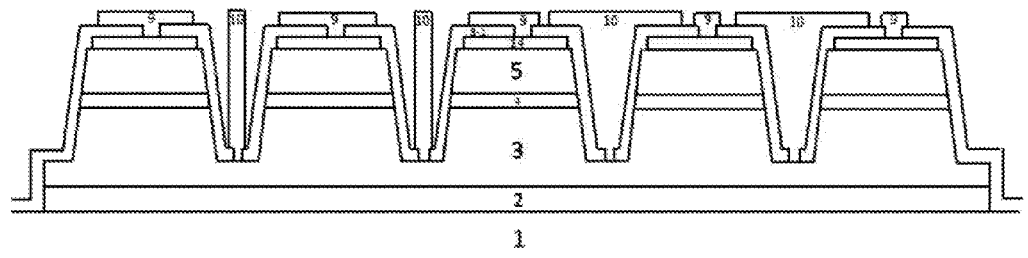

FIG. 8a is a structure diagram of the P type contact metal and the N type contact metal of which entire surface is metal.

Figure 8B:
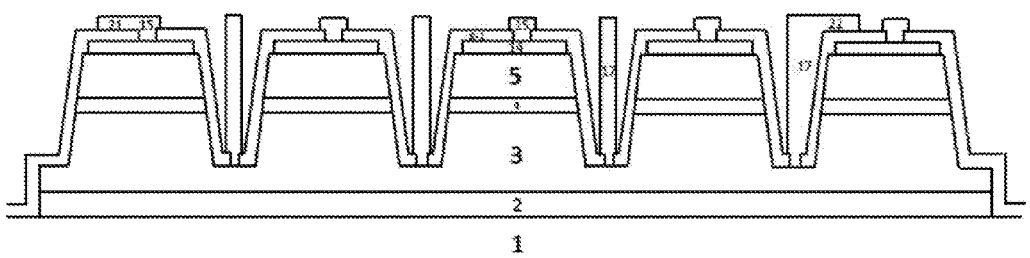

FIG. 8b is a structure diagram of the P type contact metal comprising of linear electrode and the P type connection metal, and the N type contact metal comprising of the N type linear electrode and the N type connection metal.

The diagrams from FIG. 2a to FIG. 2d, FIG. 8a and FIG. 9 to FIG. 10 area structure diagram of making flow of the flip-chip LED chip which comprises the single-layer oxide insulation layer and P type contact metal and N type contact metal of which entire surface is metal.

Figure 11:
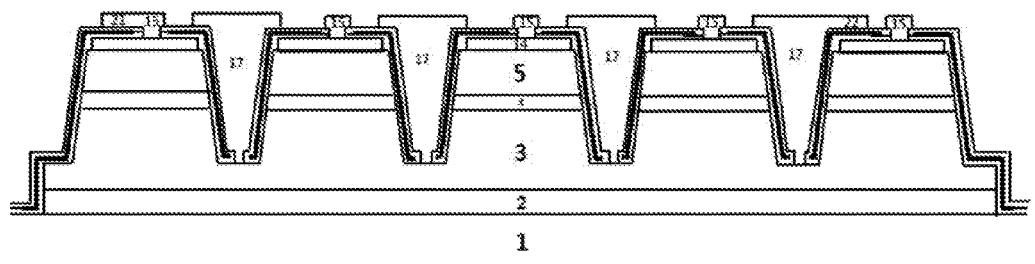
Figure 12:
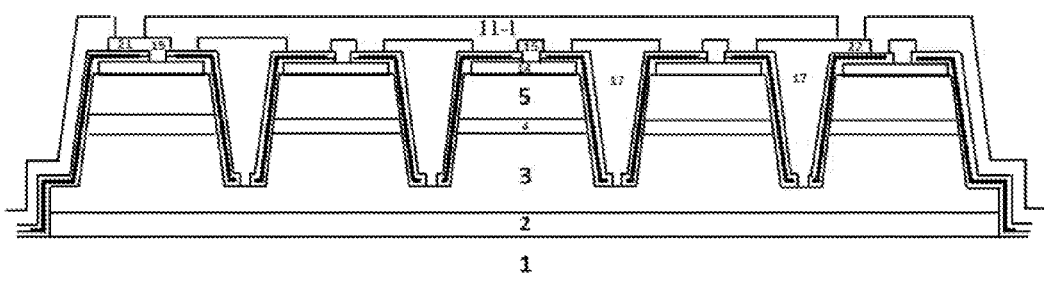
Figure 13:
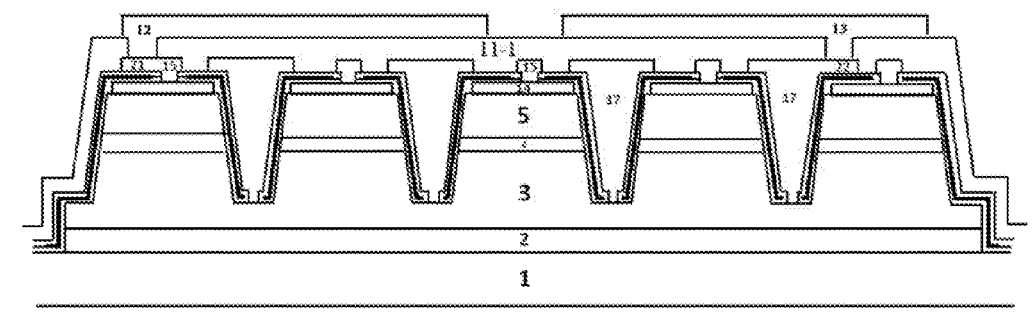

The diagram from FIG. 2a to FIG. 2c, FIG. 7a (or FIG. 7b) to FIG. 11, FIG. 12 and FIG. 13 is a structure diagram of making flow of the flip-chip LED chip which is formed by the Braggs reflective layer, the metal layer, the single (or multilayer) oxide insulation layer and of which P type contact metal comprising P type linear electrode and P type connection metal, N type contact metal comprising N type linear electrode and N type connection metal.

Figure 14:
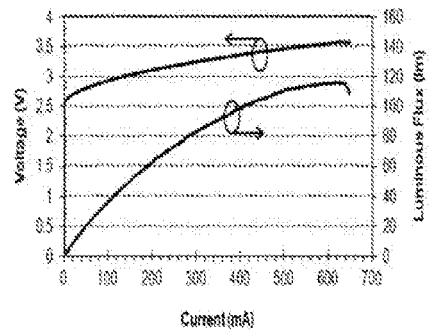

FIG. 14 is the diagram of the luminance-current-voltage characteristics of the flip-chip LED chip comprising the P type solder pad, the N type solder pad and single-layer oxide insulation layer.

Figure 15:
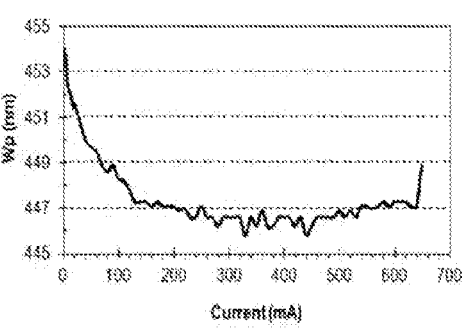

FIG. 15 is the diagram of the current characteristics and the peak wavelength of the flip-chip LED chip comprising the P type solder pad, the N type solder pad and single-layer oxide insulation layer.

Figure 16:
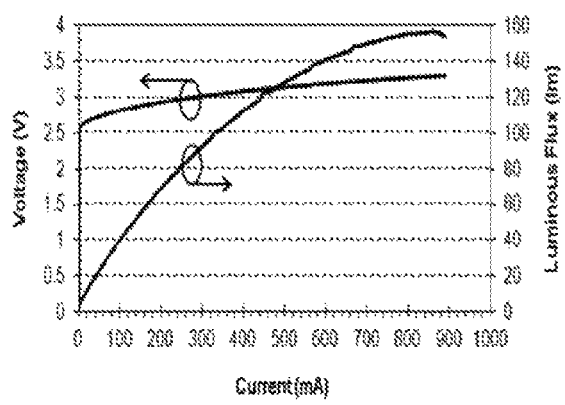

FIG. 16 is the diagram of the luminance and current and voltage characteristics of the flip-chip LED chip which is formed by the Braggs reflective layer-metal layer-the multilayer oxide insulation layer and which comprises the P type connection metal and the N type connection metal.

Figure 17:
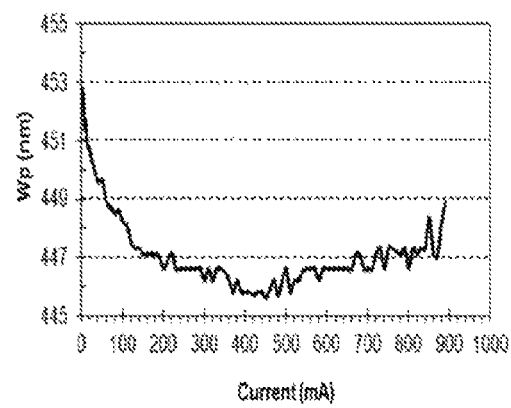

FIG. 17 is the diagram of the current characteristics and the peak wavelength of the flip-chip LED chip which is formed by the Braggs reflective layer, the metal layer and the multilayer oxide insulation layer and which comprises the P type connection metal and the N type connection metal.

In the drawings:
1—Substrate
2—Buffer layer
3—N type nitride semiconductor layer
4—Active layer
5—P type nitride semiconductor layer
6—Metal layer with high reflectivity
7—metal protection layer
8-1—the first insulation layer structure
801—single-layer oxide insulation layer
802—Metal layer
803—Braggs reflective layer
9—P type contact metal
10—N type contact metal
11-2 the second insulation layer structure
13—Flip-chip N type electrode 14—Transparent conductive layer
15—P type linear electrode
16—P type solder pad
17—N type linear electrode
18—N type solder pad
19—Linear convex mesa
19-1—The first top surface
19-2—Side surface
19-3—The second top surface
20—Isolation groove
21—P type contact metal
22—N type contact metal

DETAILED DESCRIPTION OF THE
PREFERRED EMBODIMENT

If certain words are used to refer to a specific component in the specification and claims, the skilled in the field should understand that hardware manufacturers may use different terms to name the same component. This specification and the claim does not differentiate each other in the way of the name, but uses the functional differences of the component as the criteria. As mentioned in the whole specification and claims, the word "contains" is an open language, it should be interpreted as "including but not limited to". The word "roughly" refers to the range of error acceptance, the skilled in the field should solve the technical defects within a certain a range of error and achieve the basic technical effect. In addition, the word "coupling" includes any direct and indirect means of electrical coupling. Therefore, if the description "a first coupling device coupled to a second device" is used, it means the first device can be directly connected to the second electrical coupled device, or by indirect means it is electrically coupled to the second device by the other device or coupling. The following instructions are described as preferred embodiment for the implementation of this application. However it is the general principle that the purpose of description of this application is not limited to the scope of application. The scope of protection of this application shall be subject to the requirements defined in the appended claims.

Further details of the application is provided according to the drawings, but it is not regarded as a restriction on the application.

Embodiment 1

Referring to FIG. 2a to FIG. 13, this application aims to provide a flip-chip new structure of III group semiconductor lighting emitting device. The flip-chip structure includes: a substrate 1, a buffer layer 2, an N type nitride semiconductor layer 3, an active layer 4, a P type nitride semiconductor layer 5, a first insulation layer 8-1, a P type contact metal 9, an N type contact metal 10, a second insulation layer 11-1, a flip-chip P type electrode 12, a flip-chip N type electrode 13 and a transparent conductive layer 14.

Wherein the substrate 1, the buffer layer 2, the N type nitride semiconductor layer 3, the active layer 4, the P type nitride semiconductor layer 5 which grow sequentially from bottom to top forms a nitride semiconductor structure with a linear convex mesa 19.

The linear convex mesa 19 comprises a first top surface 19-1, a side surface 19-2 and a second top surface 19-3. The first top surface 19-1 and the second top surface 19-3 individually connects with the side surface 19-2 to form an L shape structure. The first top surface 19-1 of the linear convex mesa 19 is the top surface of the P type nitride semiconductor layer 5, which forms the top surface of the linear convex mesa. The second top surface 19-3 of the linear convex mesa is the top surface of the N type nitride semiconductor layer 3, which forms the bottom surface of the linear convex mesa. The side surface 19-2 is connected between the first top surface 19-1 and the second top surface 19-3, the three above forms the linear convex mesa.

In this application, the convex mesa 19 is needed to be etched, and the area etched away is formed by single or multiple lines. Namely, the linear convex mesa 19 in this application refers to the convex mesa formed by the convex mesa after etching and cross-cut on the planar surface. As the skilled in the field known, although the area etched away must contain one or more lines, it can contain one or more dotted etching; in the application, the line width of linear etching is not restricted, and micro or nano can be acceptable.

A transparent conductive layer 14 is located on the top of the first top surface 19-1.

In the above structure, material of the transparent conductive layer 14 can be Indium tin oxide (ITO), Cadmium tin oxide, Zinc oxide, Indium oxide, Tin oxide, Copper (II) Aluminum oxide, Copper (II) Gallium (III) oxide and Strontium Copper oxide.

The flip-chip structure has an isolation groove 20, which is located around the flip-chip structure, the surface of the isolation groove comprises the first insulation layer structure 8-1 and or the second insulation structure 11-1.

In this application, the isolation groove 20 of the LED chip is correspondingly provided with any one of the following conditions:

The flip-chip structure does not set the isolation groove (such as eutectic solder);

The flip-chip structure only contains the second insulation layer 11-1 above the isolation groove;

A first insulation layer 8-1 and a second insulation layer 11-1 exists above the isolation groove The isolation groove above only contains the first insulation layer 8-1.

A first insulation layer structure 8-1 is located on the first top surface 19-1, the side surface 19-2, the second top surface 19-3 of the linear convex mesa and the transparent conductive layer 14.

In the above structure, the first insulation layer structure 8-1 is formed by the single-layer oxide insulation layer, the multilayer oxide insulation layer, and the Braggs reflective layer-metal layer-single layer oxide insulation layer, or formed by the Braggs reflective layer-metal layer-multilayer oxide insulation layer, The material of the single-layer oxide insulation layer is formed by one of aluminum oxide ($Al_2O_3$), silicon dioxide ($SiO_2$), titanium dioxide ($TiO_2$), tantalic oxide ($Ta_2O_5$), niobium oxide ($Nb_2O_5$), silicon oxide ($Si_2N_2O$) and silicon nitride ($Si_3N_4$).

Material of the multilayer oxide insulation is formed by at least two of the combinations of aluminum oxide, silicon dioxide, titanium dioxide, tantalic oxide, niobium oxide, silicon oxide and silicon nitride. The combination here is described that each kind of material can be a layer, each layer of the material can be the same or different, rather than the material is mixed then the insulation layer is deposited. The thickness of each layer of the single-layer oxide insulation layer and the multilayer oxide insulation is in a range of 30-200 nm.

The structure of the Braggs reflective layer is formed by silicon oxide and titanium oxide, or formed by silicon oxide and tantalic oxide, or formed by silicon oxide and niobium oxide. Wherein the thickness of the Braggs reflective layer is in a range of 30-1000 nm, the thickness of the titanium oxide is in a range of 10-200 nm, the thickness of the tantalic oxide is in a range of 10-200 nm, the thickness of niobium oxide is in a range of 10-200 nm.

Preferably, material structure of the Braggs reflective layer is formed by 3.5 pairs of silicon dioxide/titanium dioxide/silicon dioxide/titanium dioxide/silicon dioxide/titanium dioxide/silicon dioxide, or formed by 3.5 pairs of silicon dioxide/tantalic oxide/silicon dioxide/tantalic oxide/silicon dioxide/tantalic oxide/silicon dioxide, or formed by 3.5 pairs of silicon dioxide/niobium oxide/silicon dioxide/niobium oxide/silicon dioxide/niobium oxide/silicon dioxide.

When the first insulation layer structure 8-1 is stacked by the Braggs reflective layer-metal layer-single-layer oxide insulation layer or stacked by the Braggs reflective layer-metal layer-multilayer oxide insulation layer, the bottom end of the metal layer is located on the surface of the Braggs reflective layer of the first insulation layer structure 8-1 and in the single-layer (multilayer) oxide insulation layer of the first insulation layer structure 8-1. Such setting makes no direct contact between the metal layer and the transparent conductive layer 14, so that the insulation of the first insulation layer 8-1 comprising the metal layer 802 is ensured. In this application, the single-layer oxide insulation layer is labeled as 801, the label of the multilayer oxide insulation layer is 804, the metal layer is labeled as 802, and the Braggs reflection layer is labeled as 803.

The material of the metal layer is one or several combination of the silver (Ag), aluminum (Al), silver indium (AgIn), platinum (Pt), nickel (Ni) and titanium (Ti). Therein each the thickness of the silver, the aluminum, the silver indium and the platinum is in a range of 50-500 nm, each thickness of the nickel and titanium is in a range of 0.3-30 nm.

The bottom end of the P type contact metal 9 is located on both surfaces of the first insulation layer structure 8-1 and the transparent conductive layer 14, or on the transparent conductive layer 14.

The bottom end of the N type contact metal 10 is located on both surface of the first insulation layer structure 8-1 and the second top surface 19-3 of the convex mesa, or on the second top surface 19-3 of the linear convex mesa.

Figure 1:
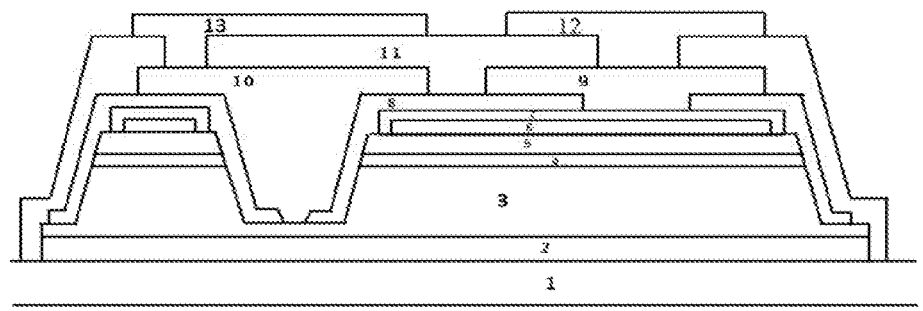
FIG. 1 is a schematic for the flip-chip structure of III group nitride semiconductor light emitting device in prior art.
Figure 2A:
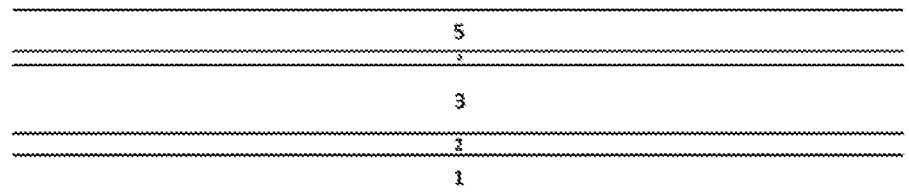
FIG. 2a to FIG. 2g are a schematic of making flow of the flip-chip LED chip which is formed by the P type solder pad and the N type solder pad.
Figure 2B:
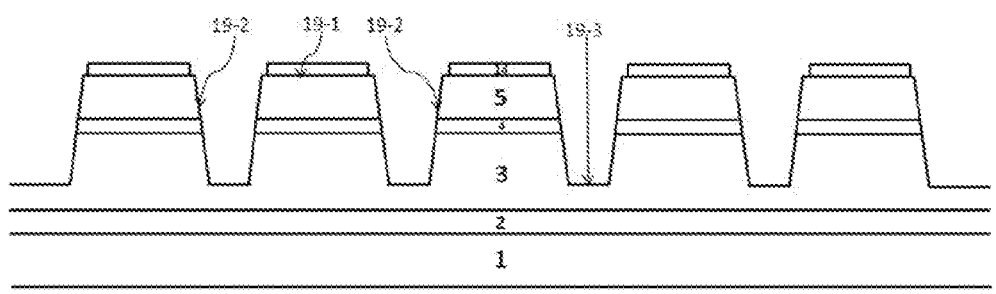
Figure 2C:
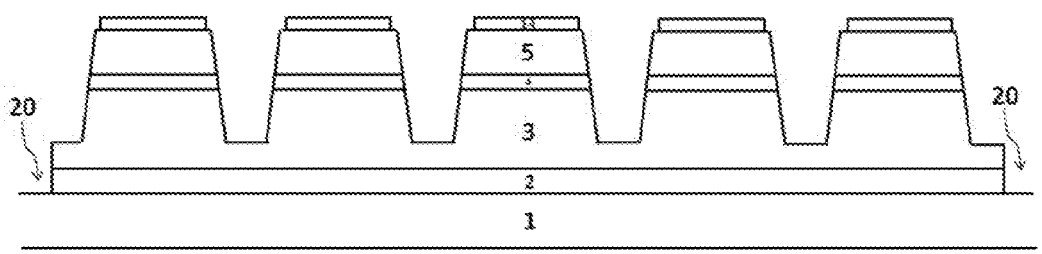
Figure 2D:
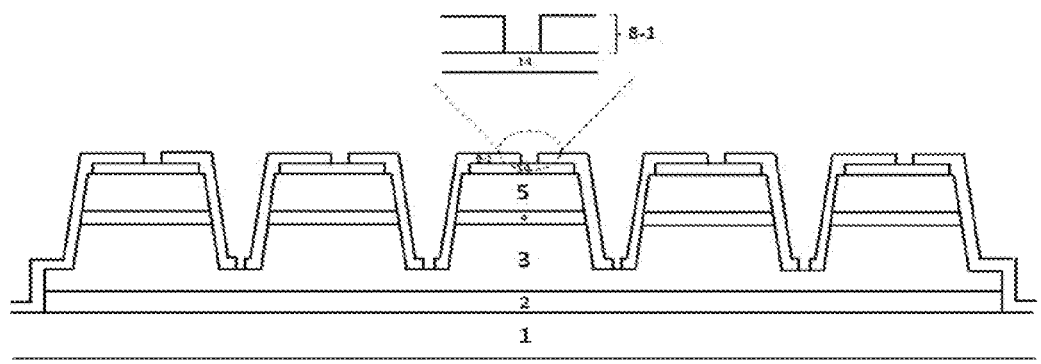
Figure 2E:
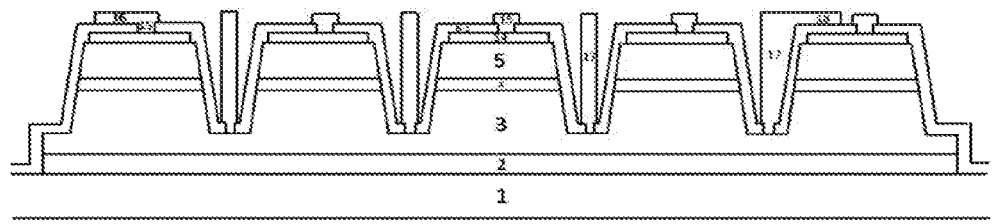

The structure of the P type contact metal 9 and the N type contact metal 10 can be classified into three types, as referred to FIG. 8a, FIG. 2e and FIG. 8b individually:

The P type contact metal is a metal on entire surface, the bottom end of the metal on the entire surface is located on the surface of the first insulation layer structure 8-1 and the transparent conductive layer 14, and the exposed transparent conductive layer 14 is covered entirely by the metal on the entire surface; The N type contact metal 10 is a metal on entire surface, the bottom end of the metal on the entire surface located on the surface of the first insulation layer structure 8-1 and the second top surface 19-3 of the convex mesa, and the exposed second upper surface 19-3 is covered by the metal on the entire surface.

The P type contact metal 9 comprises a P type linear electrode 15 and a P type solder pad 16, the bottom end of the P type solder pad is located on the surface of the first insulation layer structure 8-1, the bottom end of the P type linear electrode 15 is located on the transparent conductive layer 6 (as shown in FIG. 5a), or on the surface of the first insulation layer and the transparent conductive layer 6 (as shown in FIG. 5b);

The N type contact metal 10 comprises a N type linear electrode 17 and a N type solder pad 18, the bottom end of the N type solder pad 18 is located on the surface of the first insulation layer structure 8-1, the bottom end of the N type linear electrode 17 is located on the second top surface 19-3 (as shown in FIG. 6a) of the convex mesa, or on the first insulation layer structure 8-1 and the second top surface (as shown in FIG. 6b or FIG. 6c) of the convex mesa;

The P type contact metal 9 comprises a P type linear electrode 15 and a P type connection metal 21, the bottom end of the P type linear electrode 15 is located on the transparent conductive layer 6 (as shown in FIG. 5a) or on both surfaces of the first insulation layer structure 8-1 and the transparent conductive layer 6 (as shown in FIG. 5b), the bottom end of the P type connection metal 21 is located on the surface of the first insulation layer structure 8-1.

The N type contact metal 10 comprises an N type linear electrode 17 and an N type connection metal 22, the bottom end of the N type linear electrode 17 is located on the second top surface 19-3 (as shown in FIG. 6a) of the linear convex mesa or on the first insulation layer structure 8-1 and the second top surface 19-3 (as shown in FIG. 6b or FIG. 6c), the bottom end of the N type connection metal 22 is located on the surface of the first insulation layer structure 8-1.

As the skilled in the field known, the main difference between the solder pad of the scheme (2) and the connection metal of scheme (3) is in that both the size and the shape of the solder pad are fixed, while both the size and the shape of the connection metal are not restricted.

As the skilled in the field known, no matter which one the first insulating layer 8-1 is formed by of the single-layer oxide insulation layer, multilayer oxide insulation layer, Braggs reflective layer-metal layer-single-layer oxide insulation layer and the Braggs reflective layer-metal layer-multilayer oxide insulation layer, both the P type contact metal 9 and the N type contact metal 10 can be formed by any one of the three above.

In this application, the structure of the P type contact metal 9 and the N type contact metal is formed by the single-layer metal layer or multilayer metal layer.

Both structures of the P type contact metal 9 and the N type contact metal are formed by the single-layer metal layer, the material of which is one of the Aluminum (Al), Titanium (Ti), Platinum (Pt), Gold (Au), Rhodium (Rh), tungsten (W), Nickel (Ni), silver (Ag) or silver indium, wherein thickness of the single-layer metal layer is in a range of 50-3000 nm.

Both structures of the P type contact metal 9 and the N type contact metal is formed by the multilayer metal layer which sequentially grows the first metal layer, the middle metal layer, the end metal layer from inner to outer. Material of the first metal layer is one of the nickel, titanium chromium. Material of the middle metal layer is at least one combination of the Aluminum, titanium, chromium, platinum, gold, rhodium, tungsten, nickel, silver or silver indium. Material of the end metal layer is one of the nickel, titanium, and chromium. Wherein thickness of the first metal layer is in a range of 0.3-300 nm, thickness of the middle metal layer is in a range of 10-3000 nm, thickness of the end metal layer is in a range of 0.3-300 nm.

The top surfaces of the first insulation layer structure 8-1, the P type contact metal 9 and the N type contact metal 10 comprise a second insulation layer structure 11-1.

The structure of the second insulation layer 11-1 is formed by a single-layer oxide insulation layer or a multilayer oxide insulation layer, wherein the material of the single-layer oxide insulation layer is formed by one of aluminum oxide, silicon dioxide, titanium dioxide, tantalic oxide, niobium oxide, silicon oxide and silicon nitride, the multilayer oxide insulation is formed by at least two of the combinations of aluminum oxide, silicon dioxide, titanium dioxide, tantalic oxide, niobium oxide, silicon oxide and silicon nitride, a thickness of each layer of the single-layer oxide insulation layer and the multilayer oxide insulation is in a range of 30-2000 nm.

Similarly, no matter which of the four case the first insulation layer belongs to, and which of the three cases the P type contact metal 9 and the N type contact metal 10 belongs to, structure of the second insulation layer 11-1 can be single-layer oxide insulation layer or multilayer insulation layer.

The bottom of the flip-chip P type electrode 12 is located on the surface of the P type contact metal 9 and the second insulation layer 11-1.

The bottom of the flip-chip N type electrode 13 is located on the surface of the N type contact metal 10 and the second insulation layer 11-1.

Both structures of the flip-chip P type electrode 12 and the flip-chip N type electrode 13 sequentially comprise a Ti layer, a second Ni layer, an Au layer from inner to outer, or sequentially comprise a middle Cr layer, a Pt layer, an Au layer, the second Ni layer, a Pt layer, the second Ni layer, an Au—Sn layer from inner to outer, or sequentially comprise a first Ni layer, an Al layer, the second Ni layer, the Au layer from inner to outer, or sequentially comprise the middle Cr layer, the Pt layer, the Au layer from inner to outer, or sequentially comprise the middle Cr layer, the second Ni layer, the Au layer from inner to outer, or sequentially comprise a first Ni layer, the Al layer, the middle Cr layer, the second Ni layer and the Au layer from inner to outer, or sequentially comprise a first Ni layer, the Al layer, the middle Cr layer, the Pt layer and the Au layer from inner to outer, or sequentially comprise a first Ni layer, the Al layer, the second Ni layer, the Pt layer and the Au layer from inner to outer, or sequentially comprise a first Ni layer, the Al layer, the Ti layer, the Pt layer and the Au layer from inner to outer, or sequentially comprise a first Cr layer, the Al layer, the middle Cr layer, the Pt layer and the Au layer from inner to outer, or sequentially comprise a first Cr layer, the Al layer, the Ni layer, the Pt layer and the Au layer from inner to outer.

Therein the thickness of the first Ni layer is in a range of 0.4-3 nm, the thickness of the second Ni layer is in a range of 10-300 nm, the thickness of the Ti layer is in a range of 10-300 nm, the thickness of the Al layer is in a range of 50-300 nm, the thickness of the Au layer is in a range of 20-3000 nm, the thickness of the first Cr layer is in a range of 0.4-5 nm, the thickness of the middle Cr layer is in a range of 10-300 nm, the thickness of the Pt layer is in a range of 10-300 nm, the thickness of the AuSn layer is in a range of 1000-5000 nm.

It is described necessarily when the packing of eutectic is used in the new flip-chip structure; it can be used as the outermost layer of the AuSn flip-chip P type electrode and the flip-chip N type electrode.

This application aims to provide a flip-chip structure of III group semiconductor light emitting device; the detailed manufacturing method as shown in FIG. 2 includes the following steps:

The first step: structure diagram shown as FIG. 2a, growing the substrate 1, the buffer layer 2, the N type nitride semiconductor 3, the active layer 4 and the P type nitride semiconductor 5 sequentially from bottom to top to form an epitaxial structure, wherein the top surface of the epitaxial structure is the top surface of the P type nitride semiconductor layer 5, the epitaxial structure is attained from the manufacturing process of prior art.

The second step: structure diagram shown as FIG. 2b, which including: the transparent conductive layer 14 is deposited on the top surface of the P type nitride semiconductor 5, the pattern of the linear convex mesa 19 is defined by the yellow light etching process, then the transparent conductive layer 14, the P type nitride semiconductor layer 5 and the active layer 4 are etched to expose the N type nitride semiconductor layer 3, then the transparent conductive layer 14 is shrined by the etching solution, finally the photoresist is removed to attain the linear convex mesa 19 of which the top surface comprises the transparent conductive layer 14. It is described necessarily the transparent conductive layer 14 and the linear convex mesa can be made individually in this step.

In this application, making the transparent conductive layer 14 and the linear convex mesa 19 in the meantime is that the transparent conductive layer 14 is deposited by the metal on the entire surface of the P type nitride semiconductor 5, then the transparent conductive layer 14 and the linear convex mesa 19 is attained on the same etching step. There are two ways to make the transparent conductive layer 14 and the linear convex mesa 19 individually. One way is to make the transparent conductive layer 14 at first, then make the linear convex mesa 19, the details is to define the shape of the transparent conductive layer 14, and to deposit the transparent conductive layer 14 on the P type nitride semiconductor 5, finally define the shape of the convex mesa and etch to attain the linear convex mesa 19.

Another way is to make the linear convex mesa 19 at first, then make the transparent conductive layer 14, namely, define the shape of the convex mesa and make etching to attain the linear convex mesa 19, then deposit the transparent conductive layer 14 on the first top surface 19-1 of the convex mesa.

The third step: structure diagram shown as FIG. 2c, defining the pattern of isolation groove 20 with the yellow light etching process, then etching the N type nitride semiconductor layer 3 and the buffer layer 2 to expose the substrate 1, finally removing the photo resist. This step can be located in any steps behind this step.

As described above, the LED chip can include isolation groove 20 or not include the isolation groove, and the isolation groove is normally set before the insulation structure. When the LED chip is shipped with normal structure, the isolation groove is set before the first insulation structure 8-1, so that the top of the isolation groove comprises the first insulation layer 8-1 and the second insulation layer 11-1; the setting of isolation groove can be on any step after the setting of the first insulation layer structure 8-1 and before the setting of the second insulation layer structure 11-1.

The forth step: when the structure of the first insulation layer 8-1 is formed by the oxide insulation layer as shown in FIG. 2d, the forth step includes that: the first insulation layer structure 8-1 is deposited to form a single-layer or multilayer oxide insulation layer, then contact pattern of the P type contact metal 9, the transparent conductive layer 14, the N type contact metal 10 and the second top surface 19-3 of the linear convex mesa is defined with yellow light stripping process, the connection pattern of the first insulation layer structure 8-1 is etched with dry and wet method, and the photo resist is removed by the stripping process to get the connecting pattern of multilayer of oxide insulation and Braggs reflective layer is continuously etched, finally the photo resist is removed to get the first insulation layer structure 8-1.

When the first insulation layer structure 8-1 is stacked by the Braggs reflective layer-metal layer-single-layer (multilayer) oxide insulation layer as shown in FIG. 7a or FIG. 7b, the forth step includes that: the Braggs reflective layer 803 is deposited at first, and the pattern of the metal layer is deposited by the yellow light stripping process, the metal is deposited, finally the photo resist is removed by the stripping process to attain the metal layer 802, then the single-layer (or multilayer) oxide insulation layer 801(804) is deposited, then contact pattern of the P type contact metal 9, the transparent conductive layer 14, the N type contact metal 10 and the second top surface 19-3 of the linear convex mesa is defined with yellow light stripping process, then the connection pattern of the single-layer (or multilayer) oxide insulation layer and the Braggs reflective layer is continuously etched, finally the photo resist is removed to attain the first insulation layer structure 8-1. The shape of connection pattern can be dotted, lined or faced which is not restricted in this application.

The fifth step: structure diagram shown as FIG. 2e and FIG. 8a and FIG. 8b, the fifth step includes that: the pattern of the P type contact metal 9 and the N type contact metal 10 are defined by the yellow light stripping process, and P type contact metal 9 and the N type contact metal 10 are deposited by the use of electron beam evaporation in the mean time, then the photo resist is removed with the stripping process to get the P type contact metal 9 and the N type contact metal 10.

As shown in FIG. 8a, the P type contact metal 9 and the N type contact metal 10 are metal on the whole surface, the bottom end of the metal on the whole surface of the P type contact metal 9 is located on the top surface of the first insulation layer structure 8-1 and on the transparent conductive layer 6, the bottom end of the metal on the whole surface of the N type contact metal 10 is located on the surface of the first insulation layer 8-1 and the second surface 19-3 of the linear convex mesa.

As shown in FIG. 2e, the P type contact metal 9 and the N type contact metal 10 comprise the P type linear electrode 15, the N type linear electrode 17, the P type solder pad 16 and the N type solder pad 18, the bottom end of the P type solder pad 16 is located on the surface of the first insulation layer structure 8-1, the bottom end of the P type linear electrode 15 is located on the transparent conductive layer 14 or on the surface of the first insulation layer structure 8-1 and on the transparent conductive layer 14; the N type contact metal 10 comprises the N type linear electrode 17 and the N type solder pad, the bottom end of the N type solder pad is located on the surface of the first insulation layer 8-1, the bottom end of the N type linear electrode 17 is located on the second top surface 19-3 of the linear convex mesa or on the first insulation layer structure 8-1 and the second surface 19-3 of the linear convex mesa.

As shown in FIG. 8b, the P type contact metal 9 and the N type contact metal 10 are formed by the P type linear electrode 15, the N type linear electrode 17, the P type connection metal 21 and the N type connection metal 22. The bottom end of the P type linear electrode 15 is located on the transparent conductive layer 14 or on both surfaces of the first insulation layer structure 8-1 and on the transparent conductive layer 14. The bottom end of the P type connection metal 21 is located on the surface of the first insulation layer structure 8-1. The bottom end of the N type linear electrode 17 is located on the second surface 19-3 of the linear convex mesa or on the first insulation layer structure 8-1 and the second surface 19-3 of the linear convex mesa, the bottom end of the N type connection metal 22 is located on the surface of the first insulation layer structure 8-1.

Figure 2F:
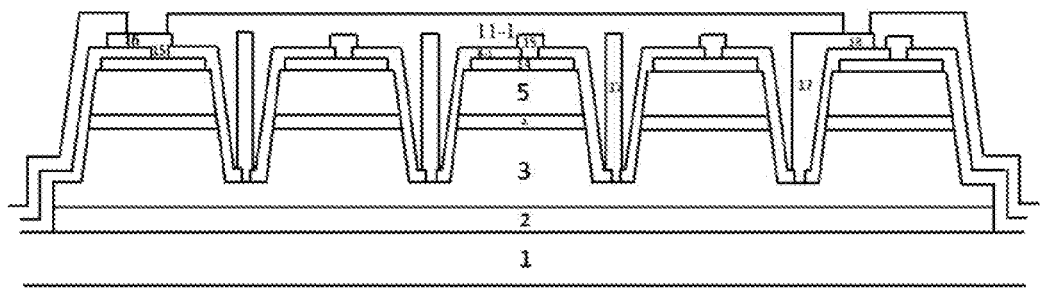

The sixth step: structure diagram shown in FIG. 2f, the fifth step includes that: the second insulation layer structure 11-1 is deposited, then the pattern of accessing and opening of the P type contact metal 9 and the N type contact metal 10 is defined with yellow light stripping process, finally, the photo resist is removed. Similarly, the shape of the opening pattern for access of this step can be dotted, lined or faced and it is not restricted in this application The seventh step: structure diagram shown as FIG. 2g, the fifth step includes that: the pattern of the flip-chip P type electrode 12 and the flip-chip N type electrode 13 are defined by the yellow light stripping process, and the flip-chip P type electrode 12 and the flip-chip N type electrode 13 are deposited in the mean time, then the photo resist is removed with the stripping process.

The eighth step: the wafer is thinned, diced, separated, tested and sorted, the steps are obtained through the production process of the prior art.

Embodiment 2

All the flip-chip structure in this embodiment is provided for using the linear convex mesa 19 to replace a plurality of holes (vias).

Figure 3A:
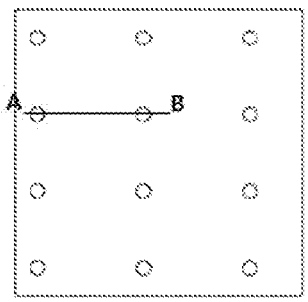
FIG. 3a to FIG. 3b are the top view and cross-section view of the multi visa in prior art respectively.
Figure 3B:
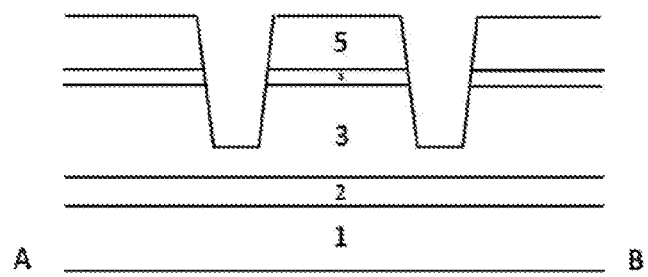

FIG. 3a is shown as a top view showing the plurality of holes (visa) in prior art. FIG. 3b is shown as a sectional view along A-B direction.

Figure 4A:
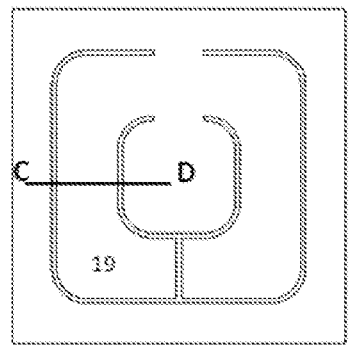
FIG. 4a to FIG. 4b are the top view and cross-section view of linear convex mesa respectively.
Figure 4B:
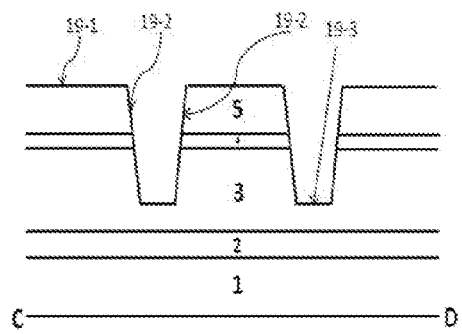

FIG. 4a is shown as the top view of linear convex mesa, FIG. 4b is shown as a sectional view along C-C direction.

The area etched away of linear convex mesa 19 is formed by the single line or multiline The substrate 1, the buffer layer 2, the N type nitride semiconductor layer 3, the active layer structure 4, the P type nitride semiconductor layer 5 form a nitride semiconductor with a linear convex mesa 19.

The linear convex mesa comprises the first top surface 19-1, the side surface 19-2 and the second top surface 19-3, two ends of the first top surface are individually provided with the L shape surface which is formed by the side surface and the second top surface.

The first top surface 19-1 of the linear convex mesa is the top surface of the P type nitride semiconductor layer, the second surface 19-3 of the linear convex mesa is the top surface of the N type nitride semiconductor layer.

Embodiment 3

In this embodiment, based on the EMBODIMENT 2, the bottom end of the P type linear electrode 15 is located on the transparent conductive layer 14 (as shown in FIG. 5a, the P type contact metal 9 comprises the P type linear electrode 15) or on the surface of the first insulation layer 8-1 and the transparent conductive layer 14 (as shown in FIG. 5b, the P type contact metal 9 is formed by the metal on the whole surface or comprises the P type linear electrode 15)

Embodiment 4

Based on the EMBODIMENT 2, the N type linear electrode 17 is located on the second top surface 19-2 of the linear convex mesa, namely the top surface of the N type nitride semiconductor layer (as shown in FIG. 6a, the N type contact metal 10 comprises the N type linear electrode 17), or in the groove covering the linear convex mesa 19 of the N type electrode 17 (as shown in FIG. 6c), located in on the first insulation layer structure 8-1 and on the second top surface 19-3 of the linear convex mesa (as shown in FIG. 6b or FIG. 6c, the N type contact metal 10 is formed by the metal on the whole surface or comprises the N type linear electrode 17).

Embodiment 5

Based on the EMBODIMENT 1, as shown in FIG. 2d, the first insulation layer structure is formed by the single-layer (or multilayer) oxide insulation layer.

The material of the single-layer (or multilayer) oxide insulation layer is one or several combinations of the aluminum oxide, silicon oxide, titanium oxide, tantalic oxide, niobium oxide, silicon oxide and silicon nitride, wherein each layer thickness of single-layer (or multilayer) oxide insulation layer is in a range of 30-2000 nm.

In this embodiment, manufacturing method of the single-layer (or multilayer) oxide insulation layer which forms the first insulation layer structure 8-1 is as following:

Using a method such as chemical vapor deposition or optical coating machine deposition to fabricate single-layer or multilayer oxide insulating layer, then define a first insulating layer structure of 8-1 pattern by using of the yellow light etching process, and etching the pattern of the first insulating layer structure 8-1 with dry or wet method, finally removing the photo resist to attain the first insulating layer structure 8-1, wherein the gas used in dry etching method is $SF_6/O_2$ or $CF_4/CHF_3/O_2$.

Embodiment 6

Based on the EMBODIMENT 1, on the fourth step of the chip making as shown in FIG. 7a or FIG. 7b, the structure of the first insulation layer 8-1 in this embodiment is stacked by the Braggs reflective layer-metal layer-single-layer (multilayer) oxide insulation layer.

Wherein, the first insulation layer 8-1 of side surface 19-2 in FIG. 7a does not include metal layer 802, but the first insulation layer 8-1 of side surface 19-2 in FIG. 7b includes metal layer 802. Namely, the first insulation layer 8-1 of side surface 19-2 can be formed by the Braggs reflective layer-oxide insulation layer, but the first insulation layer 8-1 on the transparent conductive layer 14 is stacked by the Braggs reflective layer-metal layer-oxide insulation layer.

The structure of the Braggs reflective layer is formed by silicon oxide and titanium oxide, or silicon oxide and tantalic oxide, or silicon oxide and niobium oxide, wherein the thickness of the silicon oxide is in a range of 30-1000 nm, the thickness of the titanium oxide is in a range of 10-200 nm, the thickness of the tantalic oxide is in a range of 10-200 nm, the thickness of niobium oxide is in a range of 10-200 nm.

Preferably, the Braggs reflective layer is formed by 3.5 pairs of silicon dioxide/titanium dioxide/silicon dioxide/titanium dioxide/silicon dioxide/titanium dioxide/silicon dioxide, or formed by 3.5 pairs of silicon dioxide/tantalic oxide/silicon dioxide/tantalic oxide/silicon dioxide/tantalic oxide/silicon dioxide, or formed by 3.5 pairs of silicon dioxide/niobium oxide/silicon dioxide/niobium oxide/silicon dioxide/niobium oxide/silicon dioxide.

In this embodiment, the structure of the first insulation layer 8-1 is the Braggs reflective layer, metal layer and single-layer oxide insulation layer or the Braggs reflective, metal layer and multilayer oxide insulation layer, a bottom end of the metal layer is located on the top surface of the Braggs reflective layer of the first insulation layer structure 8-1, and/or is located in the single-layer (or multilayer) of the oxide insulation layer of the first insulation layer structure 8-1. "And" here refers to contacting the top surface of the Braggs reflective layer of the first insulating layer structure 8-1 and single-layer (or multilayer) oxide insulation layer of the first insulation layer structure 8-1 at the same time. Wherein the material of the metal layer is at least one combination of the silver, aluminum, silver indium, platinum, nickel and titanium, the rein the thickness of the silver, the aluminum, the silver indium and the platinum is in a range of 50-500 nm, the thickness of the nickel and titanium is in a range of 0.3-30 nm.

The material of the single-layer (or multilayer) of the oxide insulation layer is formed by one or several combinations of aluminum oxide, silicon dioxide, titanium dioxide, tantalic oxide, niobium oxide, silicon oxide and silicon nitride, a thickness of each layer of the single-layer (or multilayer) oxide insulation layer is in a range of 30-2000 nm.

Based on the EMBODIMENT 1, the manufacturing method of the first insulation layer structure 8-1 which is formed by the Braggs reflective layer-metal layer-single-layer (or multilayer) oxide insulation layer is as the following: depositing the Braggs reflective first, the defining the pattern of the metal layer and depositing the metal layer with yellow light stripping process, the removing the photo resist with the stripping process to attain the metal layer, then depositing the singly layer (or multilayer) oxide insulation layer, and defining the connection pattern of the P type contact metal 9, the transparent conductive layer 14, the N type contact metal 10 and the second top surface 19-3 of the linear convex mesa, then continuously etching the connection pattern of the single-layer (or multilayer) oxide insulation layer and the Braggs reflective layer, finally remove the photo resist to attain the first insulation layer structure 8-1.

In this application, if the structure of the first insulation layer 8-1 is stacked by the Braggs reflective layer-metal layer-single-layer (multilayer) oxide insulation layer and plated with the P type contact metal 9 and the N type contact metal 10, the photoelectric characteristic of the flip-chip structure can be measured out on this step.

Embodiment 7

Based on the EMBODIMENT 1, on the fifth step of the chip making, as shown in FIG. 8a, FIG. 2e or FIG. 8b, the method includes: defining the pattern of the P type contact metal 9 and N type contact metal 10 with yellow light stripping process, in the meantime, depositing the P type contact metal and the N type contact metal 10, finally removing the photo resist with the stripping process to attain the p type contact metal 9 and the N type contact metal 10.

As shown in FIG. 8a, the P type contact metal 9 and the N type contact metal 10 is covered with metal on the whole surface, the bottom end of the P type contact metal 9 with whole surface metal is located on the surface of the first insulation layer structure 8-1 and on the transparent conductive layer 14, the bottom end of the N type contact metal 10 with whole surface metal is located on the surface of the first insulation layer structure 8-1 and on the second top surface 19-3.

As shown in FIG. 2e, the P type contact metal 9 and the N type contact metal 10 comprise the P type linear electrode 15, the N type linear electrode 17, the P type solder pad 16 and the N type solder pad 18, the bottom end of the P type solder pad 16 is located on the surface of the first insulation layer structure 8-1, the bottom end of the p type linear electrode 15 is located on the transparent conductive layer 14 or on the surface of the first insulation layer structure 8-1 and the transparent conductive layer 14; the N type contact metal 10 comprises the N type linear electrode 17 and the N type solder pad 18, the bottom end of the N type solder pad 18 is located on the surface of the first insulation layer structure 8-1, the bottom end of the N type electrode 17 is located on the second top surface 19-3 of the linear convex mesa or located on the first insulation layer structure 8-1 and the second surface 19-3 of the linear convex mesa.

As shown in FIG. 8b, the P type contact metal 9 and the N type contact metal 10 comprise the P type linear electrode 15, the N type linear electrode 17, the P type connection metal 21 and the N type connection metal 22, the bottom end of the P type linear electrode 15 is located on the transparent conductive layer 14 or located on the surface of the first insulation layer 8-1 and the transparent conductive layer 14, the bottom end of the N type linear electrode 17 is located on the second top surface 19-3 of the linear convex mesa, the bottom end of the P type connection metal 21 and the N type connection metal 22 is located on the surface of the first insulation layer structure 8-1.

Embodiment 8

In this embodiment, on the sixth step of chip making, the second insulation layer structure 11-1 is formed by the single-layer (or multilayer) oxide insulation layer.

The top surface of the first insulation layer structure 8-1, the P type contact metal 9 and the N type contact metal 10 comprise the second insulation layer structure 11-1.

In the technique scheme, the structure of the second insulation layer 11-1 is formed by the single-layer (or multilayer) oxide insulation layer.

In this embodiment, the material of the single-layer oxide insulation layer is one of the aluminum oxide, silicon oxide, titanium oxide, tantalic oxide, niobium oxide, silicon oxide and silicon nitride.

In this embodiment, the material of the multilayer oxide insulation layer is several combinations of the aluminum oxide, silicon oxide, titanium oxide, tantalic oxide, niobium oxide, silicon oxide and silicon nitride.

In the embodiment, the thickness of each layer of single-layer oxide insulation layer or multilayer oxide insulation layer is in a range of 30-200 nm.

The structure of the preferred multilayer oxide insulation layer comprises titanium oxide and silicon oxide, the thickness of the titanium oxide is in a range of 10-300 nm, the thickness of the silicon oxide is in a range of 100-1000 nm.

Embodiment 9

Based on the EMBODIMENT 1, EMBODIMENT 2, EMBODIMENT 3, EMBODIMENT 4, EMBODIMENT 5, EMBODIMENT 6, EMBODIMENT 7, EMBODIMENT 8, the flip-chip light emitting device is made with the specification of 760 um×250 um. The manufacturing method for a flip-chip light emitting device of III group nitride semiconductor includes the following steps:

The first step: structure diagram as shown in FIG. 2a, the first step includes that: is growing the substrate 1, the buffer layer 2, the N type nitride semiconductor 3, the active layer 4 and the P type nitride semiconductor 5 sequentially from bottom to top to form an epitaxial structure, wherein the top surface of the epitaxial structure is the top surface of the P type nitride semiconductor layer 5, the epitaxial structure is attained from the manufacturing process of prior art.

The second step: structure diagram shown as FIG. 2b, by way of electron beam evaporation or sputtering, or reactive plasma deposition (reactive plasma, deposition, RPD), depositing ITO (indium tin oxide) to form the transparent conductive layer 14 on the surface of the P type nitride semiconductor 5, wherein the ITO thickness is 10-400 nm, then defining a pattern of a linear convex mesa 19 by using of the yellow light etching process, then etching with ICP on the transparent conductive layer 14 and the P type nitride semiconductor layer 5 and active layer 4, exposing N type nitride semiconductor layer 3, and shrinking the transparent conductive layer 14 with the etching solution, finally removing the photo resist to get the linear convex mesa 19 whose the top surface has transparent conductive layer 14 (the transparent conductive layer 14 and the linear convex mesa 19 can be done individually); then annealing Wafer on high temperature to make sure the good ohm Contact and penetration rate is formed between transparent conductive layer 14 and the P type nitride semiconductor layer 5. Annealing method: using fast annealing furnace (RTA) for fast annealing, the temperature is 560 degrees Celsius, the timeslot is 3 minutes.

The third step: structure diagram shown as FIG. 2c, a method: defining the pattern of isolation groove 20 with the yellow light etching process, then etching the N type nitride semiconductor layer 3 and the buffer layer 2 to expose the substrate 1, finally removing the photo resist. This step can be located in any steps behind this step.

The forth step: the structure of the first insulation layer 8-1 is formed by the oxide insulation layer, structure diagram shown in FIG. 2d, the first insulation layer structure 8-1 is deposited with PECVD, the thickness is in a range of 30-2000 nm, wherein the power is 50 W, pressure is 850 mTorr, temperature is 200-400° C., N2O is 1000 sccm, 5% SiH4/N2 is 400 sccm.

The contact pattern of the P type contact metal 9, the transparent conductive layer 14, the N type contact metal 10 and the second top surface 19-3 of the linear convex mesa is defined with yellow light stripping process, the connection pattern of the first insulation layer structure 8-1 is etched with dry and wet method, and the photo resist is removed by the stripping process to get the connecting pattern of multilayer of oxide insulation and Braggs reflective layer is continuously etched, finally the photo resist is removed to get the first insulation layer structure 8-1.

The fifth step: structure diagram shown as FIG. 2e, method including: defining the pattern of the P type contact metal 9 and the N type contact metal 10 by the yellow light stripping process (including P type linear electrode 15, N type linear electrode 17 and P type solder pad and N type solder pad 18), and depositing P type contact metal 9 and N type contact metal 10 by the use of electron beam evaporation in the mean time, then the photo resist is removed with the stripping process to get the P type contact metal 9 and N type contact metal 10.

In this embodiment, P type contact metal 9 and N type contact metal 10 has the same structure, and both sequentially comprise with the first Ni layer, Al layer, Ni layer, the second Au layer and the third Ni layer from inner to outer, wherein the thickness of the first Ni layer is in a range of 0.4-3 nm, the thickness of the Al layer is in a range of 50-300 nm layer, the thickness of the second Ni layer is in a range of 10-300 nm, the thickness of the Au layer is in a range of 10-3000 nm, the thickness of the third Ni layer in a range of is 0.4-3 nm.

The sixth step: the structure of the second insulation layer 11-1 is formed by the single-layer oxide insulation layer, structure diagram shown in FIG. 2f, the second insulation layer structure 11-1 is deposited with PECVD, the thickness is in a range of 30-2000 nm, wherein the power is 50 W, pressure is 850 mTorr, temperature is 200-400° C., $N_2O$ is 1000 sccm, 5% $SiH_4/N_2$ is 400 sccm.

The pattern of accessing and opening of the P type contact metal 9 and the N type contact metal 10 is defined with yellow light stripping process, the opening pattern of the second insulation layer structure 11-1 is etched with dry and wet method, and the photo resist is removed.

Figure 2G:
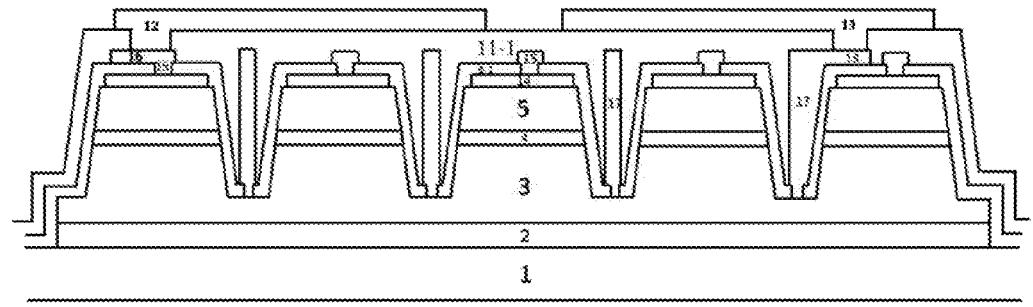

The seventh step: structure diagram shown as FIG. 2g, method including: defining the pattern of the flip-chip P type electrode 1/2 and the flip-chip N type electrode 13 by the yellow light stripping process, and depositing the flip-chip P type electrode 12 and the flip-chip N type electrode 13 by the use of electron beam evaporation in the mean time, then the photo resist is removed with the stripping process.

In this embodiment, the P type electrode 12 and the N type electrode 13 have the same structure, and both sequentially grow the titanium layer, the second Ni layer and the Au layer from inner to outer, or sequentially grow the first Ni layer, the Al layer, the second Ni layer and the Au layer from inner to outer wherein the thickness of the Ti layer is in a range of 10-300 nm, the thickness of the first Ni layer is in a range of 0.4-3 nm, the thickness of the second Ni layer is in a range of 10-300 nm, the thickness of the Al layer is in a range of 50-300 nm, the thickness of the Au layer in a range of is 20-3000 nm.

The eighth step: the wafer is thinned, diced, separated, tested and sorted, the steps are obtained through the production process of the prior art.

The ninth step: packing the flip chip package and measuring the photoelectric characteristic.

As shown in FIG. 14 and FIG. 15, the photoelectric properties of the product can be found: when input current is 60 mA and the voltage is 2.82V, then the product brightness is 23.4 lm (color 6807K) and the peak wavelength is 449.5 nm, when input current is 150 mA and the voltage is 3.02V, then the product brightness is 50.31 lm (color 7095K) and the peak wavelength is 447.3 nm, when input current is 620 mA and the voltage is 3.56V, then the product brightness is 116.3 lm (color 7832K) and the peak wavelength is 447.3 nm; From FIG. 14 and FIG. 15, it is concluded that this product is provided with higher operating current and lower voltage and higher brightness and less wavelength shift, compared with the normal structure product.

In this application, when the first insulation layer structure 8-1 is formed by the single-layer oxide insulation layer, it is plated with the P type contact metal 9 and the N type contact metal 10, the P type contact metal 9 and the N type contact metal 10 are comprising the P type linear electrode 15, the N type linear electrode 17, the P type solder pad 16, the N type solder pad 18, the structure diagram FIG. 2e shows the normal structure. In this step, the photoelectric properties of the normal structure can be measured out, and the photoelectric properties of the flip-chip structure can be conjectured, such as the conjecture does not meet the photoelectric properties of the flip-chip structure. In this step, shipment with normal structure or rework can also be done.

Embodiment 10

Based on the EMBODIMENT 1, EMBODIMENT 2, EMBODIMENT 3, EMBODIMENT 4, EMBODIMENT 5, EMBODIMENT 6, EMBODIMENT 7, EMBODIMENT 8, the flip-chip light emitting device is made with the specification-760 um×250 um. The manufacturing method for a flip-chip light emitting device of III group nitride semiconductor includes the following steps:

The first step: structure diagram as shown in FIG. 2a, the method is growing the substrate 1, the buffer layer 2, the N type nitride semiconductor 3, the active layer 4 and the P type nitride semiconductor 5 sequentially from bottom to top to form an epitaxial structure, wherein the top surface of the epitaxial structure is the top surface of the P type nitride semiconductor layer 5, the epitaxial structure is attained from the manufacturing process of prior art.

The second step: structure diagram shown as FIG. 2b, by way of electron beam evaporation or sputtering, or reactive plasma deposition (reactive plasma, deposition, RPD), depositing ITO (indium tin oxide) to form the transparent conductive layer 14 on the surface of the P type nitride semiconductor 5, wherein the ITO thickness is 10-400 nm, then defining a pattern of a linear convex mesa 19 by using of the yellow light etching process, then etching with ICP on the transparent conductive layer 14 and the P type nitride semiconductor layer 5 and active layer 4, exposing N type nitride semiconductor layer 3, and shrinking the transparent conductive layer 14 with the etching solution, finally removing the photo resist to get the linear convex mesa 19 whose the top surface has transparent conductive layer 14 (the transparent conductive layer 14 and the linear convex mesa 19 can be done individually); then annealing Wafer on high temperature to make sure the good ohm Contact and penetration rate is formed between transparent conductive layer 14 and the P type nitride semiconductor layer 5. Annealing method: using fast annealing furnace (RTA) for fast annealing, the temperature is 560 degrees Celsius, the timeslot is 3 minutes.

The third step: structure diagram shown as FIG. 2c, a method: defining the pattern of isolation groove 20 with the yellow light etching process, then etching the N type nitride semiconductor layer 3 and the buffer layer 2 to expose the substrate 1, finally removing the photo resist. This step can be located in any steps behind this step.

The forth step: the structure of the first insulation layer 8-1 is formed by the oxide insulation layer, structure diagram shown in FIG. 2d, the first insulation layer structure 8-1 is deposited with PECVD, the thickness is in a range of 30-2000 nm, wherein the power is 50 W, pressure is 850 mTorr, temperature is 200-400° C., $N_2O$ is 1000 sccm, 5% $SiH_4/N_2$ is 400 sccm.

Then contact pattern of the P type contact metal 9, the transparent conductive layer 14, the N type contact metal 10 and the second top surface 19-3 of the linear convex mesa is defined with yellow light stripping process, the connection pattern of the first insulation layer structure 8-1 is etched with dry and wet method, and the photo resist is removed by the stripping process to get then the connecting pattern of multilayer of oxide insulation and Braggs reflective layer is continuously etched, finally the photo resist is removed to get the first insulation layer structure 8-1.

The fifth step: structure diagram shown as FIG. 8a, method including: defining the pattern of the P type contact metal 9 and the N type contact metal 10 to cover the whole surface by the yellow light stripping process, and depositing P type contact metal 9 and N type contact metal 10 by the use of electron beam evaporation in the mean time, then the photo resist is removed with the stripping process to get the P type contact metal 9 and N type contact metal 10.

In this embodiment, P type contact metal 9 and N type contact metal 10 have the same structure, and both sequentially comprise with the first Ni layer, Al layer, Ni layer, the second Au layer and the third Ni layer from inner to outer, wherein the thickness of the first Ni layer is in a range of 0.4-3 nm, the thickness of the Al layer is in a range of 50-300 nm layer, the thickness of the second Ni layer is in a range of 10-300 nm, the thickness of the Au layer is in a range of 10-3000 nm, the thickness of the third Ni layer in a range of is 0.4-3 nm.

Figure 9:
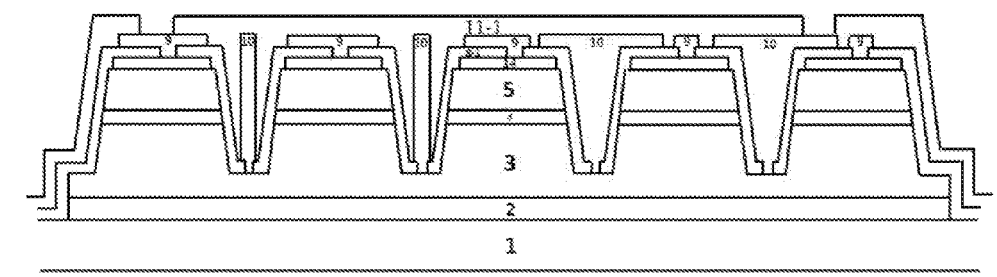

The sixth step: the structure of the second insulation layer 11-1 is formed by the single-layer oxide insulation layer, structure diagram shown in FIG. 9, the second insulation layer structure 11-1 is deposited with PECVD, the thickness is in a range of 30-2000 nm, wherein the power is 50 W, pressure is 850 mTorr, temperature is 200-400° C., $N_2O$ is 1000 sccm, 5% $SiH_4/N_2$ is 400 sccm.

Then the pattern of accessing and opening of the P type contact metal 9 and the N type contact metal 10 is defined with yellow light stripping process, the opening pattern of the second insulation layer structure 11-1 is etched with dry and wet method, and the photo resist is removed.

Figure 10:
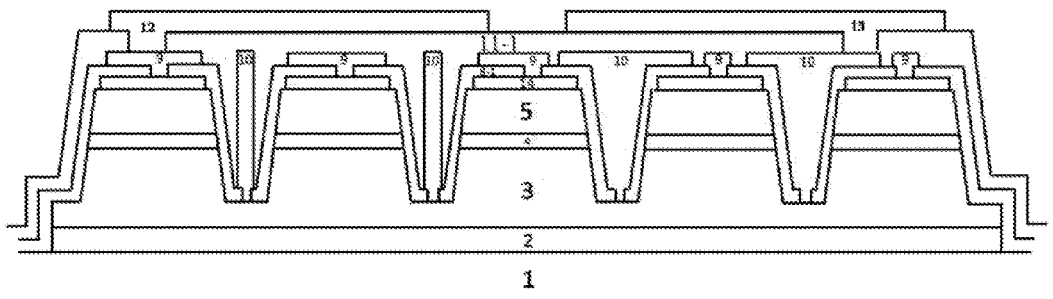

The seventh step: structure diagram shown as FIG. 10, method including: defining the pattern of the flip-chip P type electrode 12 and the flip-chip N type electrode 13 by the yellow light stripping process, and depositing the flip-chip P type electrode 12 and the flip-chip N type electrode 13 by the use of electron beam evaporation in the mean time, then the photo resist is removed with the stripping process.

In this embodiment, the P type electrode 12 and the N type electrode 13 have the same structure, and both sequentially grow the titanium layer, the second Ni layer and the Au layer from inner to outer, or sequentially grow the first Ni layer, the Al layer, the second Ni layer and the Au layer from inner to outer wherein the thickness of the Ti layer is in a range of 10-300 nm, the thickness of the first Ni layer is in a range of 0.4-3 nm, the thickness of the second Ni layer is in a range of 10-300 nm, the thickness of the Al layer is in a range of 50-300 nm, the thickness of the Au layer in a range of is 20-3000 nm.

The eighth step: the wafer is thinned, diced, separated, tested and sorted, the steps are obtained through the production process of the prior art.

The ninth step: packing the flip chip package and measuring the photoelectric characteristic.

The manufacturing method of the EMBODIMENT 10 and EMBODIMENT 9 is the same, the only difference is on the fifth step, the P type contact metal 9 and the N type contact metal 10 is covered with whole surface metal, other steps are the same.

Test conditions is the same as the one of EMBODIMENT 9, provided that the technical product of EMBODIMENT 9 is labelled as S1, the technical product is labelled as S2 according to the manufacturing method of EMBODIMENT 10, make test under the same condition, test result is shown in table 1:

TABLE 1 comparison of the test result

| | Input current (mA) | Voltage (V) | Brightness (lm) | Peak wavelength (nm) |
|---|---|---|---|---|
| S1 | 60 mA | 2.83 | 23.4 | 449.5 |
| | 150 mA | 3.02 | 50.3 | 447.3 |
| | 620 mA | 3.56 | 116.3 | 447.3 |
| S2 | 60 mA | 2.84 | 23.1 | 449.6 |
| | 150 mA | 3.01 | 50.5 | 447.5 |
| | 620 mA | 3.55 | 117.6 | 447.5 |

It is concluded from the table 1 that the photoelectric of S1 and S2 is almost the same.

Embodiment 11

Based on the EMBODIMENT 1, EMBODIMENT 2, EMBODIMENT 3, EMBODIMENT 4, EMBODIMENT 5, EMBODIMENT 6, EMBODIMENT 7, EMBODIMENT 8, the flip-chip light emitting device is made with the specification-840 um×410 um. The manufacturing method for a flip-chip light emitting device of III group nitride semiconductor includes the following steps:

The first step: structure diagram as shown in FIG. 2a, the method is growing the substrate 1, the buffer layer 2, the N type nitride semiconductor 3, the active layer 4 and the P type nitride semiconductor 5 sequentially from bottom to top to form an epitaxial structure, wherein the top surface of the epitaxial structure is the top surface of the P type nitride semiconductor layer 5, the epitaxial structure is attained from the manufacturing process of prior art.

The second step: structure diagram shown as FIG. 2b, by way of electron beam evaporation or sputtering, or reactive plasma deposition (reactive plasma, deposition, RPD), depositing ITO (indium tin oxide) to form the transparent conductive layer 14 on the surface of the P type nitride semiconductor 5, wherein the ITO thickness is 10-400 nm, then defining a pattern of a linear convex mesa 19 by using of the yellow light etching process, then etching with ICP on the transparent conductive layer 14 and the P type nitride semiconductor layer 5 and active layer 4, exposing N type nitride semiconductor layer 3, and shrinking the transparent conductive layer 14 with the etching solution, finally removing the photo resist to get the linear convex mesa 19 whose the top surface has transparent conductive layer 14 (the transparent conductive layer 14 and the linear convex mesa 19 can be done individually); then annealing Wafer on high temperature to make sure the good ohm Contact and penetration rate is formed between transparent conductive layer 14 and the P type nitride semiconductor layer 5. Annealing method: using fast annealing furnace (RTA) for fast annealing, the temperature is 560 degrees Celsius, the timeslot is 3 minutes.

The third step: structure diagram shown as FIG. 2c, a method: defining the pattern of isolation groove 20 with the yellow light etching process, then etching the N type nitride semiconductor layer 3 and the buffer layer 2 to expose the substrate 1, finally removing the photo resist. This step can be located in any steps behind this step.

Based on the EMBODIMENT 1, the manufacturing method of the first insulation layer structure 8-1 which is formed by the Braggs reflective layer-metal layer-single-layer (or multilayer) oxide insulation layer is as the following: structure diagram shown as FIG. 7a or FIG. 7b

Depositing the Braggs reflective first with optical vacuum coating machine, then defining the pattern of the metal layer with yellow light stripping process and depositing the metal layer with electron beam evaporation, then removing the photo resist with the stripping process to attain the metal layer, then depositing the multilayer oxide insulation layer, and defining the connection pattern of the P type contact metal 9, the transparent conductive layer 14, the N type contact metal 10 and the second top surface 19-3 of the linear convex mesa, then continuously etching the connection pattern of the single-layer (or multilayer) oxide insulation layer and the Braggs reflective layer, finally remove the photo resist to attain the first insulation layer structure 8-1.

In this embodiment, the structure of the Braggs reflective layer is formed by $SiO_2/TiO_2/SiO_2/TiO_2/SiO_2/TiO_2/SiO_2$, wherein the thickness of $SiO_2$ is in a range of 30-1000 nm, the thickness of $TiO_2$ is in a range of 10-200 nm.

In this embodiment, the structure of the metal layer is the multilayer structure comprising Aluminum and Titanium, wherein the thickness of the aluminum is in a range of 50-500 nm, the thickness of the Titanium is in a range of 0.3-30 nm.

In this embodiment, the structure of the multilayer oxide insulation layer is formed by Titanium oxide and Silicon oxide, wherein the thickness of each layer is in a range of 30-2000 nm.

The fifth step: structure diagram shown as FIG. 11, method including: defining the pattern of the P type contact metal 9 and the N type contact metal 10 by the yellow light stripping process (including P type linear electrode 15, N type linear electrode 17 and P type connection metal 21 and N type connection metal), and depositing P type contact metal 9 and N type contact metal 10 by the use of electron beam evaporation in the mean time, then the photo resist is removed with the stripping process to get the P type contact metal 9 and N type contact metal 10.

In this embodiment, P type contact metal 9 and N type contact metal 10 has the same structure, and both sequentially comprise with the first Ni layer, Al layer, Ni layer, the second Au layer and the third Ni layer from inner to outer, wherein the thickness of the first Ni layer is in a range of 0.4-3 nm, the thickness of the Al layer is in a range of 50-300 nm layer, the thickness of the second Ni layer is in a range of 10-300 nm, the thickness of the Au layer is in a range of 10-3000 nm, the thickness of the third Ni layer in a range of is 0.4-3 nm.

The sixth step: the structure of the second insulation layer 11-1 is formed by the multilayer oxide insulation layer, structure diagram shown in FIG. 12, the multilayer oxide insulation layer is deposited by the optical vacuum coating machine, the structure of the multilayer oxide insulation layer is formed by the Titanium oxide and silicon oxide wherein the thickness of the Titanium is in a range of 10-300 nm, the thickness of the silicon is in a range of 100-1000 nm.

The seventh step: structure diagram shown in FIG. 13, method including: defining the pattern of the flip-chip P type electrode 12 and flip-chip P type electrode 13 by the yellow light stripping process, depositing the flip-chip P type electrode 12 and the flip-chip N type electrode 13 by the electron beam evaporation, then removing the photo resist with the stripping process.

In this embodiment, the P type electrode 12 and the N type electrode 13 have the same structure, and both sequentially grow the titanium layer, the second Ni layer and the Au layer from inner to outer, or sequentially grow the first Ni layer, the Al layer, the second Ni layer and the Au layer from inner to outer wherein the thickness of the Ti layer is in a range of 10-300 nm, the thickness of the first Ni layer is in a range of 0.4-3 nm, the thickness of the second Ni layer is in a range of 10-300 nm, the thickness of the Al layer is in a range of 50-300 nm, the thickness of the Au layer in a range of is 20-3000 nm.

The eighth step: the wafer is thinned, diced, separated, tested and sorted, the steps are obtained through the production process of the prior art.

The ninth step: packing the flip chip package and measuring the photoelectric characteristic.

The characteristic test result of the product manufactured according to the manufacturing method provided is shown, as FIG. 16 and FIG. 17:

As shown in FIG. 16 and FIG. 17, the photoelectric properties of the product can be found: when input current is 150 mA and the voltage is 2.88V, then the product brightness is 55.3 lm (color 6900K) and the peak wavelength is 447.1 nm, when input current is 300 mA and the voltage is 3.01V, then the product brightness is 92.6 lm (color 7174K) and the peak wavelength is 446.2 nm, when input current is 860 mA and the voltage is 3.29V, then the product brightness is 157.4 lm (color 7724K) and the peak wavelength is 447.1 nm; From FIG. 16 and FIG. 17, it is concluded that this product is provided with higher operating current and lower voltage and higher brightness and less wavelength shift, compared with the normal structure product.

The description above is shown and described with several preferred embodiments of the application, but as mentioned before, it should be understood the limitations of the application are not disclosed in this form, it should not be regarded as the embodiment of the exclusion of the other, and can be used for a variety of other combinations, modifications, environments; and can be described in this article for ideas within the scope of change through the teaching or related fields of technology or knowledge. The changes and changes in the field of personnel in this field shall not be separated from the spirit and scope of the application, and shall be within the scope of the protection required by the application.

What is claimed is:

1. A flip-chip structure of III group semiconductor light emitting device comprising: a substrate, a buffer layer, a N type nitride semiconductor layer, an active layer, a P type nitride semiconductor layer, a transparent conductive layer, a first insulation layer structure, a P type contact metal, a N type contact metal, a second insulation layer structure, a flip-chip P type electrode and a flip-chip N type electrode, wherein the substrate, the buffer layer, the N type nitride semiconductor layer, the active layer, the P type nitride semiconductor layer which grow sequentially from bottom to top form a linear convex mesa;
   wherein the linear convex mesa comprises a first top surface, a side surface and a second top surface, the first top surface of the linear convex mesa and the second top surface of the linear convex mesa individually connects with the side surface to form a L shape structure, the first top surface of the linear convex mesa being the top surface of the P type nitride semiconductor layer, the second top surface of the linear convex mesa being the top surface of the N type nitride semiconductor layer;
   the transparent conductive layer located on top of the first top surface of the linear convex mesa;
   the first insulation layer structure located on the first top surface of the linear convex mesa, the side surface, the second top surface of the linear convex mesa and the surface of the transparent conductive layer;
   a bottom end of the P type contact metal is located between the first insulation layer structure and the transparent conductive layers or on the transparent conductive layer;
   a bottom end of the N type contact metal located between the first insulation layer structure and the second top surfaces or on the second top surface of the linear convex mesa;
   the second insulation layer structure located on the first insulation layer structure, the top surface of the P type contact metal and the N type contact metal;
   a bottom end of the flip-chip P type electrode located on the surface of the P type contact metal and the second insulation layer structure;

a bottom end of the flip-chip N type electrode located on the surface of the N type contact metal and the second insulation layer structure, wherein the flip-chip structure has an isolation groove, which is located around the flip-chip structure, the isolation groove is attained by way of etching to expose the substrate, the surface of the isolation groove has the first insulation layer structure and/or the second insulation layer structure, the first insulation layer structure formed by the single-layer oxide insulation layer, the multilayer oxide insulation layer, and a Braggs reflective layer-metal layer-single layer oxide insulation layer or formed by a Braggs reflective layer-metal layer-multilayer oxide insulation layer.

2. The flip-chip structure of III group semiconductor light emitting device as defined in claim 1, wherein the material of the single-layer oxide insulation layer is one of aluminum oxide, silicon oxide, titanium oxide, tantalic oxide, niobium oxide and silicon nitride, the material of the multilayer oxide insulation layer is at least two of the aluminum oxide, silicon oxide, titanium oxide, tantalic oxide, niobium oxide, silicon oxide and silicon nitride.

3. The flip-chip structure of III group semiconductor light emitting device as defined in claim 1, wherein the thickness of each layer of single-layer oxide insulation layer or the thickness of each layer of the multilayer oxide insulation layer is in a range of 30-200 nm.

4. The flip-chip structure of III group semiconductor light emitting device as defined in claim 1, wherein the Braggs reflective layer is formed by silicon oxide and titanium oxide, or formed by silicon oxide and tantalic oxide, or formed by silicon oxide and niobium oxide; wherein the thickness of the silicon oxide is in a range of 30-1000 nm, the thickness of the titanium oxide is in a range of 10-200 nm, the thickness of the tantalic oxide is in a range of 10-200 nm, the thickness of niobium oxide is in a range of 10-200 nm.

5. The flip-chip structure of III group semiconductor light emitting device as defined in claim 4, wherein the Braggs reflective layer is formed by 3.5 pairs of silicon dioxide/titanium dioxide/silicon dioxide/titanium dioxide/silicon dioxide/titanium dioxide/silicon dioxide, or formed by 3.5 pairs of silicon dioxide/tantalic oxide/silicon dioxide/tantalic oxide/silicon dioxide/tantalic oxide/silicon dioxide, or formed by 3.5 pairs of silicon dioxide/niobium oxide/silicon dioxide/niobium oxide/silicon dioxide/niobium oxide/silicon dioxide.

6. The flip-chip structure of III group semiconductor light emitting device as defined in claim 5, wherein when the first insulation layer structure is stacked by the Braggs reflective layer-metal layer-single-layer oxide insulation layer or stacked by the Braggs reflective-metal layer-multilayer oxide insulation layer, the bottom end of the metal layer is located on the top surface of the Braggs reflective layer of the first insulation layer structure, and/or is located in the multilayer oxide insulation layer of the first insulation layer structure.

7. The flip-chip structure of III group semiconductor light emitting device as defined in claim 6, wherein the material of the metal layer is at least one of the silver, aluminum, silver indium, platinum, nickel and titanium, wherein each thickness of the silver, the aluminum, the silver indium and the platinum is in a range of 50-500 nm, each thickness of the nickel and titanium is in a range of 0.3-30 nm.

8. The flip-chip structure of III group semiconductor light emitting device as defined in claim 1, wherein the bottom end of the P type contact metal is located on the surface of the first insulation layer structure and the transparent conductive layer, the bottom end of the N type contact metal is located on the surface of the first insulation layer structure and the second top surface of the linear convex mesa.

9. The flip-chip structure of III group semiconductor light emitting device as defined in claim 1, wherein the P type contact metal comprises a P type linear electrode and a P type solder pad; the bottom end of the P type solder pad is located on the surface of the first insulation layer structure, the bottom end of the P type linear electrode is located on the transparent conductive layer or on both surfaces of the first insulation layer structure and the transparent conductive layer; the N type contact metal comprises N type linear electrode and a N type solder pad, the bottom end of the N type solder pad is located on the surface of the first insulation layer structure, the bottom end of the N type linear electrode is located on the second top surface of the linear convex mesa or on both surfaces of the first insulation layer structure and the second top surface of the linear convex mesa.

10. The flip-chip structure of III group semiconductor light emitting device as defined in claim 1, wherein the P type contact metal comprises a P type linear electrode and a P type contact metal, the bottom end of the P type linear electrode is located on the transparent conductive layer or on both surfaces of the first insulation layer structure and transparent conductive layer, the bottom end of the P type contact metal is located on the surface of the first insulation layer structure; the N type contact metal comprises N type linear electrode and N type connection metal, the bottom end of the N type linear electrode is located on the second top surface of the linear convex mesa or on both surfaces of the first insulation layer structure and the second top surface of the linear convex mesa, the bottom end of the N type connection metal is located on the surface of the first insulation layer structure.

11. The flip-chip structure of III group semiconductor light emitting device as defined in claim 1, wherein both structures of the P type contact metal and the N type contact metal are formed are formed by single-layer metal layer or multilayer metal layer;

when both structures of the P type metal layer and the N type metal layer are formed by the single-layer, the material of the single-layer metal layer consists of at least one of aluminum, titanium, platinum, gold, rhodium, tungsten, nickel, silver or silver indium, the thickness of the single-layer metal layer is in a range of 50-3000 nm;

when both structures of the P type metal layer and the N type metal layer are formed by multilayer metal layers, which sequentially comprises a first metal layer, a middle metal layer and an end metal layer, therein the material of the first metal layer comprises one of nickel, titanium, chromium, the material of the middle metal layer comprises at least one of aluminum, titanium, chromium, platinum, gold, rhodium, tungsten, nickel, silver, or silver indium, the material of the end metal layer comprises one of nickel, titanium and chromium, and the thickness of the first metal layer is in a range of 0.3-300 nm, the thickness of each layer of the middle metal layer is in a range of 10-3000 nm, the thickness of the end metal layer is in a range of 0.3-300 nm.

12. The flip-chip structure of III group semiconductor light emitting device as defined in claim 1, wherein the second insulation layer structure is formed by a single-layer oxide insulation layer or a multilayer oxide insulation layer, wherein the material of the single-layer oxide insulation layer is formed by one of aluminum oxide, silicon dioxide, titanium dioxide, tantalic oxide, niobium oxide, silicon oxide and silicon nitride, the multilayer oxide insulation is formed by at least two of the combinations of aluminum oxide, silicon dioxide, titanium dioxide, tantalic oxide, niobium oxide, silicon oxide and silicon nitride, a thickness of each layer of the single-layer oxide insulation layer and the multilayer oxide insulation is in a range of 30-2000 nm.

13. The flip-chip structure of III group semiconductor light emitting device as defined in claim 1, wherein both structures of the flip-chip P type electrode and the flip-chip N type electrode sequentially comprise a Ti layer, a second Ni layer, an Au layer from inner to outer, or sequentially comprise a middle Cr layer, a Pt layer, an Au layer, the second Ni layer, a Pt layer, the second Ni layer, an Au—Sn layer from inner to outer; or sequentially comprise a first Ni layer, an Al layer, the second Ni layer, the Au layer from inner to outer; or sequentially comprise the middle Cr layer, the Pt layer, the Au layer from inner to outer; or sequentially comprise the middle Cr layer, the second Ni layer and the Au layer from inner to outer; or sequentially comprise a first Ni layer, the Al layer, the middle Cr layer, the second Ni layer and the Au layer from inner to outer; or sequentially comprise a first Ni layer, the Al layer, the middle Cr layer, the Pt layer and the Au layer from inner to outer; or sequentially comprise a first Ni layer, the Al layer, the second Ni layer, the Pt layer and the Au layer from inner to outer; or sequentially comprise a first Ni layer, the Al layer, the Ti layer, the Pt layer and the Au layer from inner to outer; or sequentially comprise a first Cr layer, the Al layer, the middle Cr layer, the Pt layer and the Au layer from inner to outer; or sequentially comprise a first Cr layer, the Al layer, the Ni layer, the Pt layer and the Au layer from inner to outer; therein the thickness of the first Ni layer is in a range of 0.4-3 nm, the thickness of the second Ni layer is in a range of 10-300 nm, the thickness of the Ti layer is in a range of 10-300 nm, the thickness of the Al layer is in a range of 50-300 nm, the thickness of the Au layer is in a range of 20-3000 nm, the thickness of the first Cr layer is in a range of 0.4-5 nm, the thickness of the middle Cr layer is in a range of 10-300 nm, the thickness of the Pt layer is in a range of 10-300 nm, the thickness of the Au—Sn layer is in a range of 1000-5000 nm.

\* \* \* \* \*